US008836424B2

(12) United States Patent
Eschlboeck et al.

(10) Patent No.: US 8,836,424 B2
(45) Date of Patent: Sep. 16, 2014

(54) AMPLIFIER CIRCUIT, METHOD AND MOBILE COMMUNICATION DEVICE

(75) Inventors: Gerald Eschlboeck, Eferding (AT); Christian Mayer, Linz (AT); Andreas Schwarz, Oepping (AT); Hans Henningsen, Blokhus (DK); Konrad Hirsch, Blaustein (DE)

(73) Assignee: Intel Mobile Communications GmbH, Neubiberg (DE)

( * ) Notice: Subject to any disclaimer, the term of this patent is extended or adjusted under 35 U.S.C. 154(b) by 78 days.

(21) Appl. No.: 13/549,756

(22) Filed: Jul. 16, 2012

(65) Prior Publication Data

US 2014/0015604 A1  Jan. 16, 2014

(51) Int. Cl.
*H03G 3/20* (2006.01)

(52) U.S. Cl.
USPC .......................................... 330/133; 330/279

(58) Field of Classification Search
USPC ............ 330/51, 98, 133, 150, 278, 279, 295, 330/311; 455/127.1–127.3, 232.1, 250.1
See application file for complete search history.

(56) References Cited

U.S. PATENT DOCUMENTS

| 5,136,300 | A  | * | 8/1992 | Clarke et al. .................. 342/175 |
| 7,091,778 | B2 | * | 8/2006 | Gan et al. ...................... 330/279 |
| 8,004,368 | B2 | * | 8/2011 | Presti et al. ..................... 330/10 |
| 2003/0132800 | A1 | * | 7/2003 | Kenington ................ 330/124 R |
| 2007/0229330 | A1 |   | 10/2007 | Guda et al. |

* cited by examiner

*Primary Examiner* — Khanh V Nguyen
(74) *Attorney, Agent, or Firm* — Eschweiler & Associates, LLC

(57) ABSTRACT

An amplifier circuit includes a gain controller, a first amplifier, and a second amplifier which is coupled in series to the first amplifier, the second amplifier comprising a plurality of amplifying units. The gain controller is configured to receive a desired gain value and provide, based on the received desired gain value, a gain adjust signal to the first amplifier, and activate, based on the received desired gain value, a certain combination of amplifying units of the plurality of amplifying units of the second amplifier, such that a combined gain of the first amplifier and the active amplifying units of the second amplifier corresponds to the received desired gain value.

22 Claims, 25 Drawing Sheets

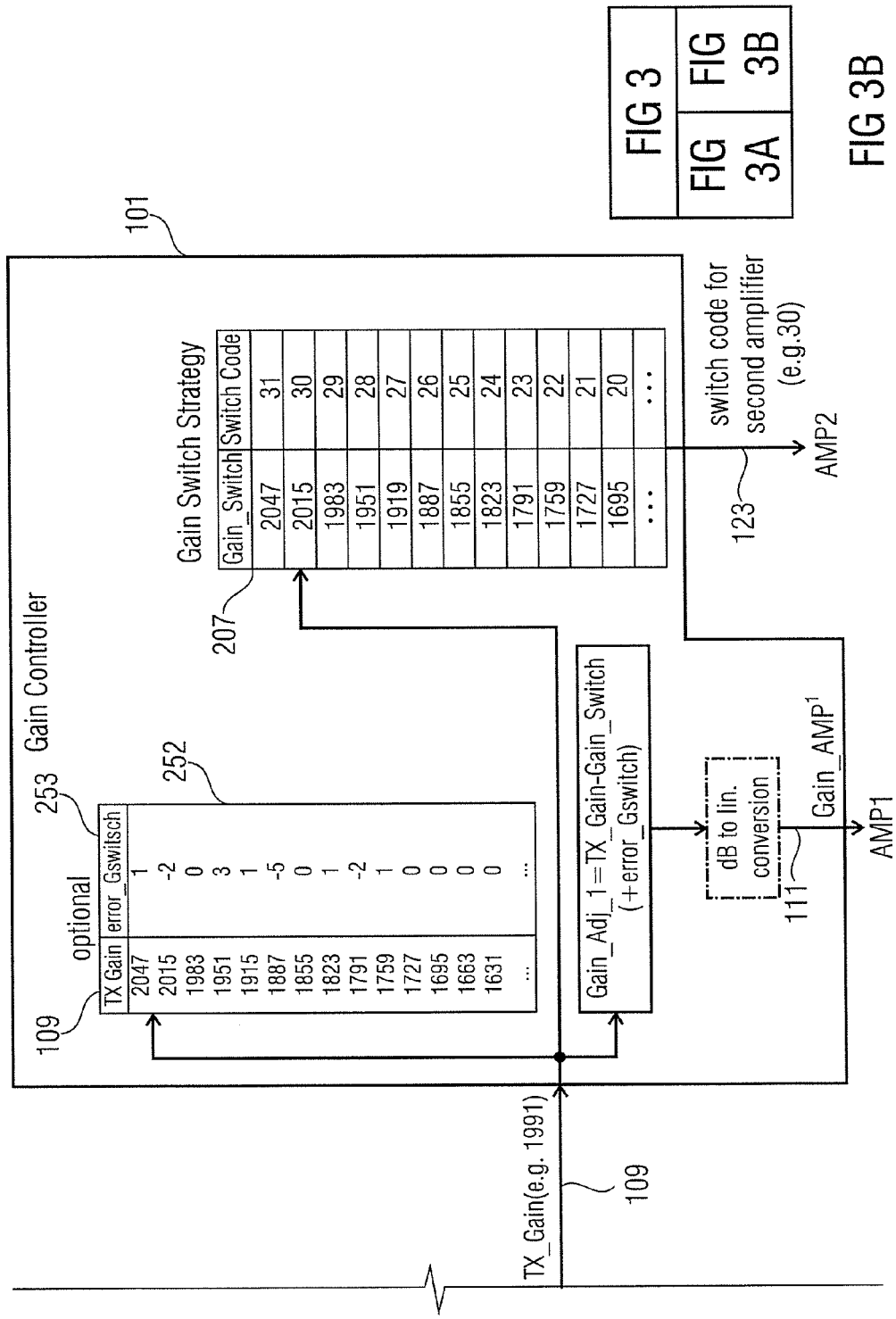

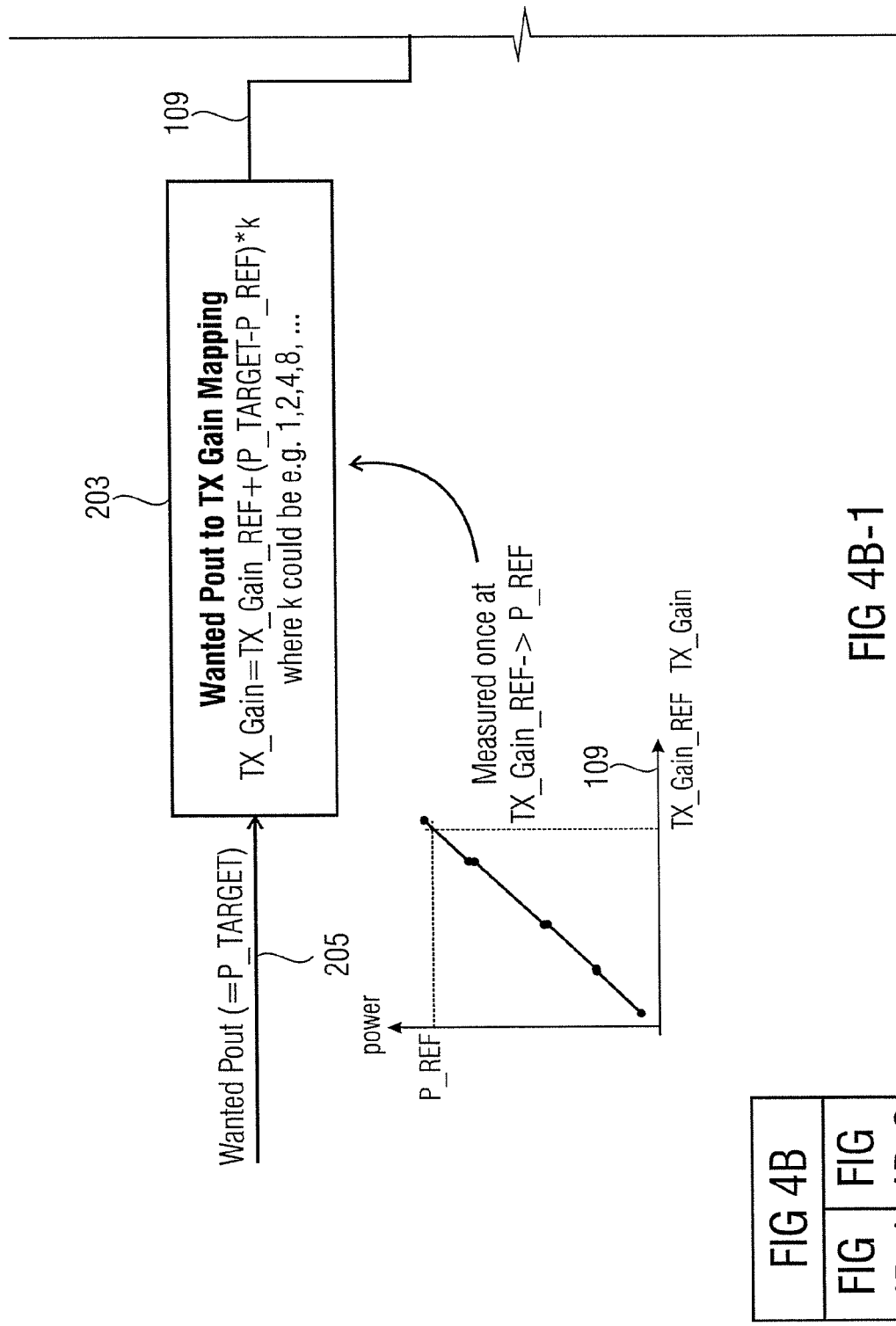

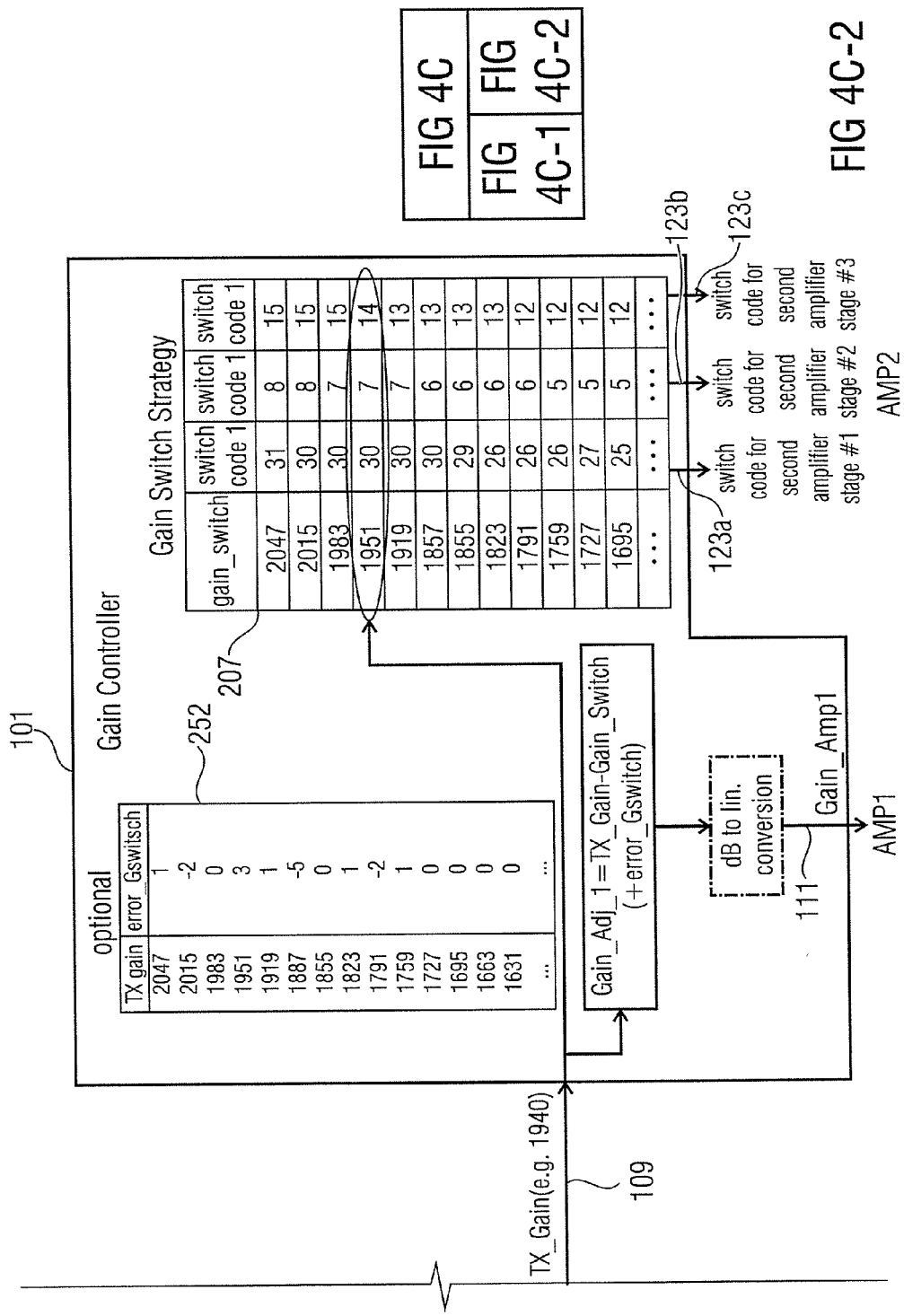

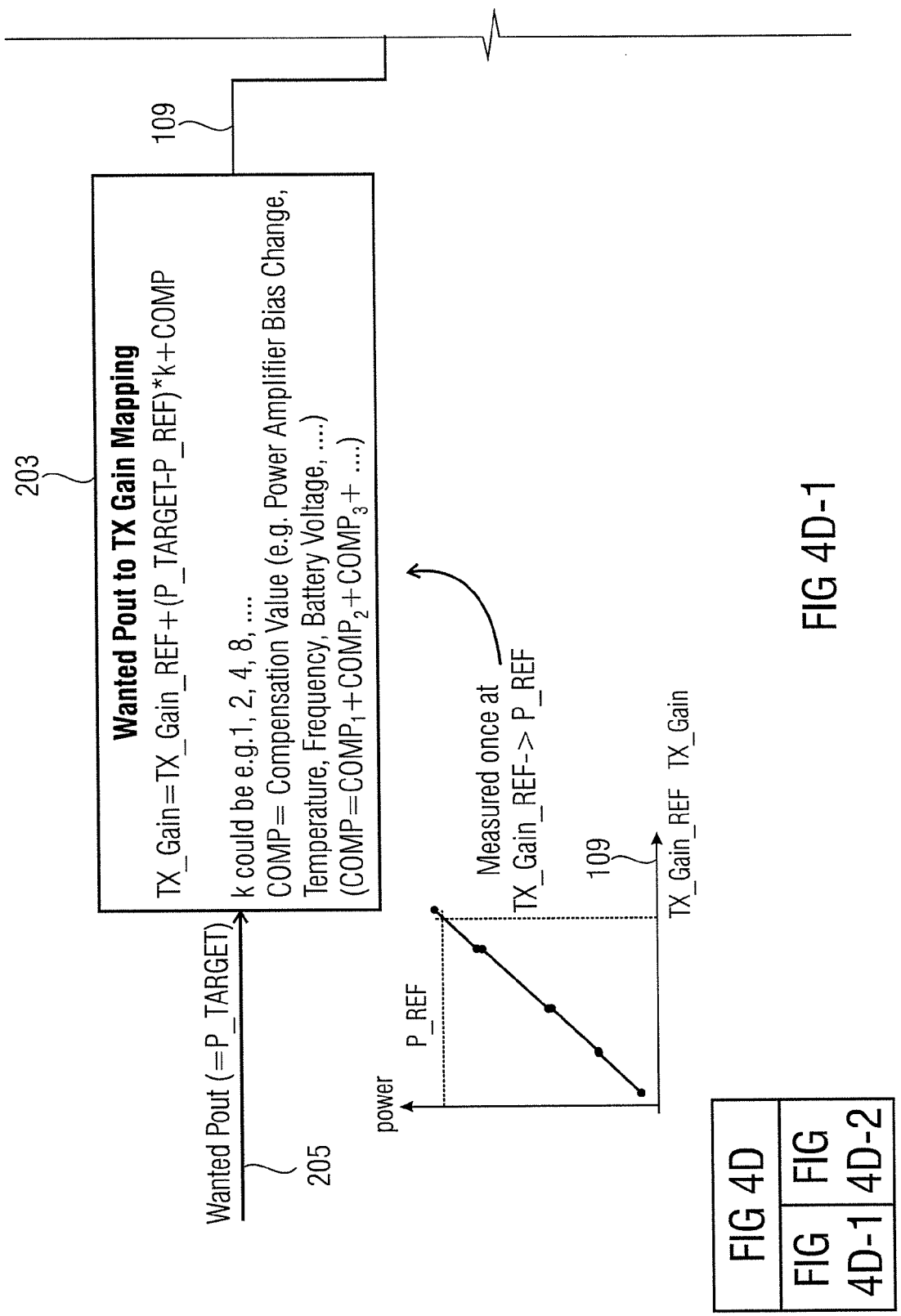

Amplifier 1

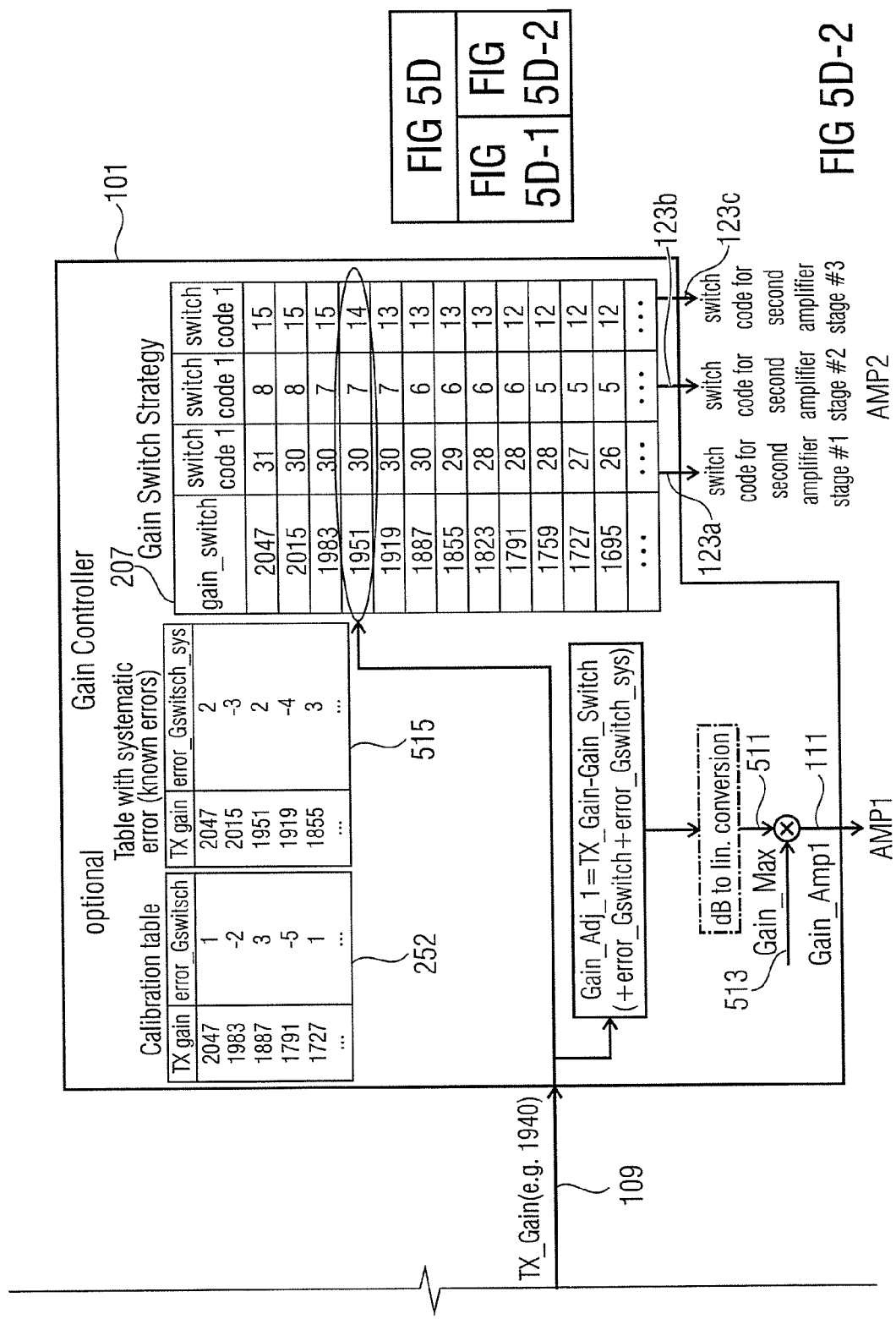

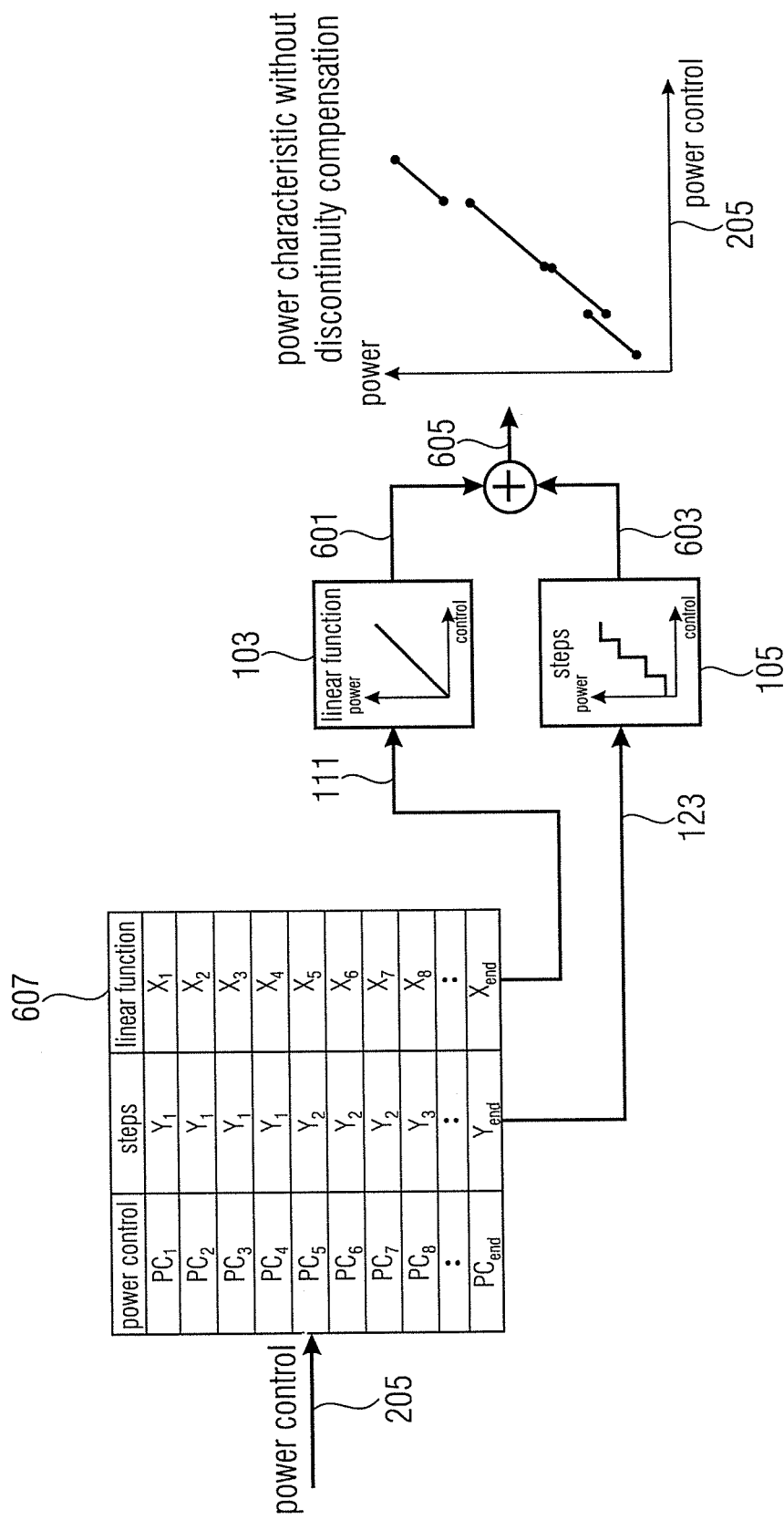

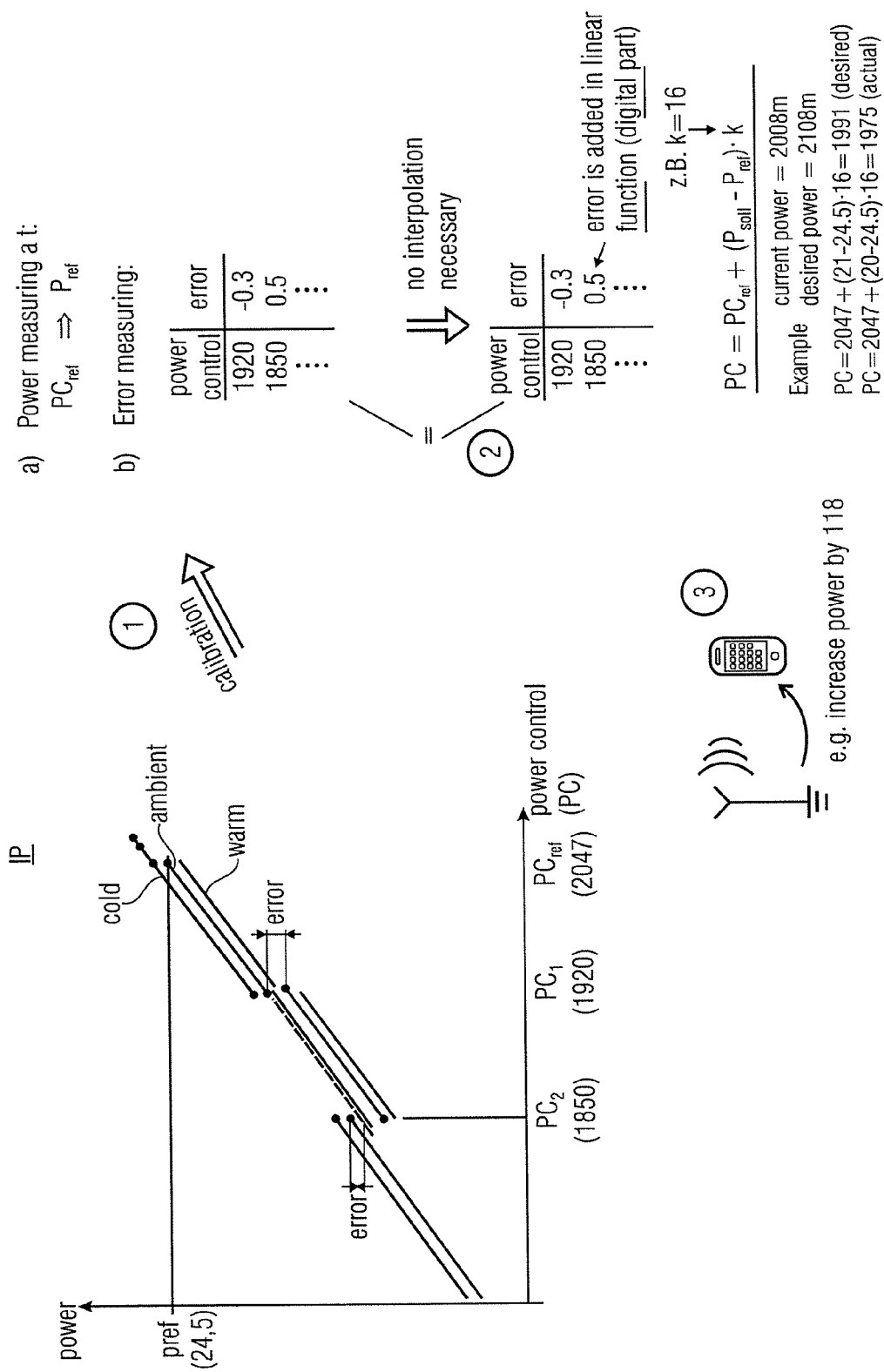

AMPLIFIER CIRCUIT, METHOD AND MOBILE COMMUNICATION DEVICE

FIELD

The present invention relates to amplifier circuits and mobile communication devices. Furthermore the present invention relates to methods for amplifying a signal.

BACKGROUND

In general an absolute and relative accuracy of power adjustment can be required for any transmit device. This accuracy requirement shall be achievable with minor effort (e.g. calibration) due to time and cost concerns.

In conventional systems, the relationship between output power and a control parameter for adjusting the power is nonlinear. A disadvantage is a complex (time consuming) calibration process. Furthermore the characteristic of the output power is mostly strongly dependent on process and temperature variations unless big effort is spent on the design.

SUMMARY

The present invention relates to an amplifier circuit comprising a gain controller, a first amplifier, and a second amplifier which is coupled in series to the first amplifier and which comprises a plurality of amplifying units. The gain controller is configured to receive a desired gain value and provide, based on the received desired gain value, a gain adjust signal to the first amplifier. Furthermore, the gain controller is configured to activate, based on the received desired gain value, a certain combination of amplifying units of the plurality of amplifying units of the second amplifier, such that a combined gain of the first amplifier and the active amplifying units of the second amplifier corresponds to the received desired gain value.

Furthermore the present invention relates to a mobile communication device comprising an antenna, an amplifier circuit and digital base band processor. The amplifier circuit comprises a gain controller, a first amplifier and a second amplifier which is coupled in series to the first amplifier, the second amplifier comprising a plurality of amplifying units. The gain controller is configured to receive a desired gain value and provide, based on the received desired gain value, a gain adjust signal to the first amplifier, and activate, based on the received desired gain value, a certain combination of amplifying units of the plurality of amplifying units of the second amplifier, such that a combined gain of the first amplifier and the active amplifying units of the second amplifier corresponds to the received desired gain value. The amplifier circuit is coupled between the antenna and the digital base band processor.

Furthermore the present invention relates to a method comprising receiving a desired gain value, a step of providing, based on the received desired gain value, a gain adjust signal to a first amplifier. The method further comprises activating, based on the received desired gain value, a certain combination of amplifying units of a plurality of amplifying units of a second amplifier, such that a combined gain of the first amplifier and the active amplifying units of the second amplifier corresponds to the received desired gain value.

BRIEF DESCRIPTION OF THE DRAWINGS

The present invention will be described in detail using the accompanying figures, in which:

FIGS. 4b to 4d show different exemplary implementations of a power to gain mapper and a gain controller which may be implemented in the amplifier circuit comprising the second amplifier shown in FIG. 4a;

FIG. 5c shows in a block schematic diagram an exemplary implementation of a power to gain mapper and a gain controller which may be used in the amplifier circuit comprising the first amplifier shown in FIG. 5a;

FIG. 6c shows as an example how the combined gain can be derived in an exemplary amplifier circuit without a discontinuity compensation;

FIG. 7 shows an application example for an amplifier circuit; and

DETAILED DESCRIPTION

Figure 1A:
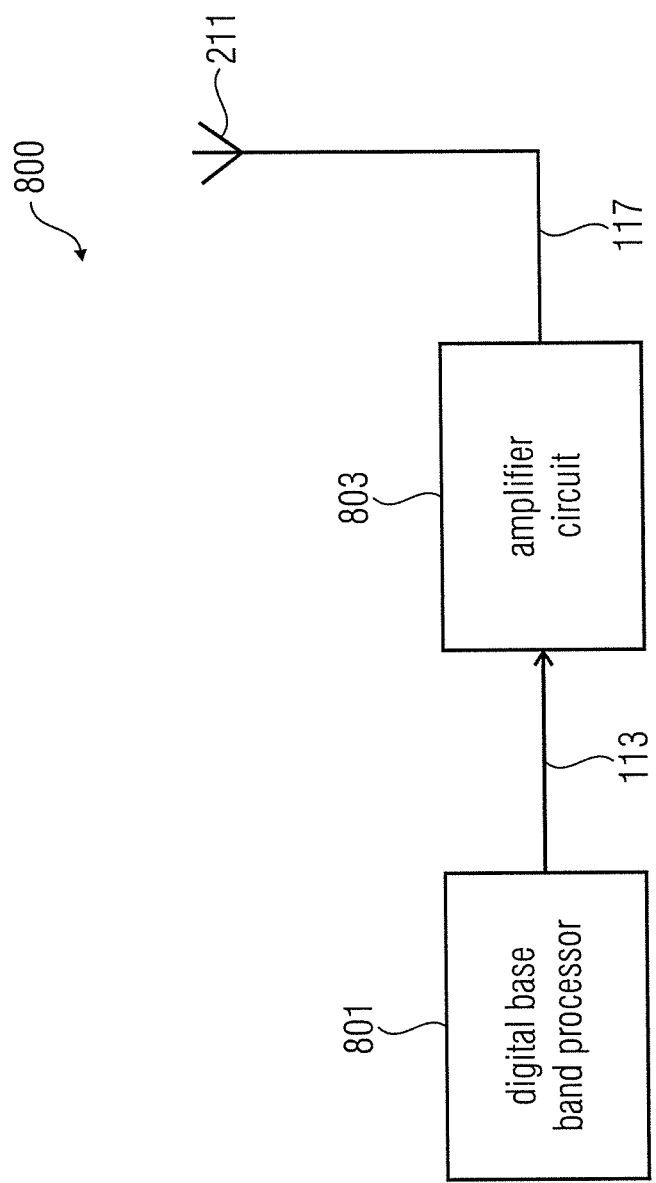
FIG. 1a shows a block schematic diagram of a mobile communication device.

FIG. 1a shows a block schematic diagram of an exemplary mobile communication device 800.

The mobile communication device 800 comprises a digital baseband processor 801, an exemplary amplifier circuit 803 (e.g. one of the amplifier circuits described herein) and an antenna 211. The amplifier circuit 803 is coupled between the digital baseband processor 801 and the antenna 211. As an example, the digital baseband processor 801 provides a first amplifier input signal 113 to the amplifier circuit 803 and the antenna 211 is configured to relay an output signal 117 of the amplifier circuit 803.

The mobile communication device 800 may be a portable mobile communication device in one embodiment.

As an example, the mobile communication device 800 can be configured to perform a voice and/or data communication (according to a mobile communication standard) with another (portable) mobile communication device and/or a mobile communication base station. Such a mobile communication device may be, for example, a mobile headset such as a mobile phone (cell phone), a so called smart phone, a tablet PC, a broadband modem, a notebook or a laptop, as well as a router, switch, repeater or a PC. Furthermore such a mobile communication device may be a mobile communication base station.

The amplifier circuit 803 enables a power adjustment in the mobile communication device 800 with low calibration efforts, less points for calibration, an easy correction of temperature, an easy determination of power control values and a very linear function between the power control values and the achieved output power of the mobile communication device.

Although in FIG. 1a, the amplifier circuit 803 is presented as part of the mobile communication device 800, this amplifier circuit may be also used in other circuits or devices. In the following, different examples of such amplifier circuit will be described in more detail.

Figure 1B:
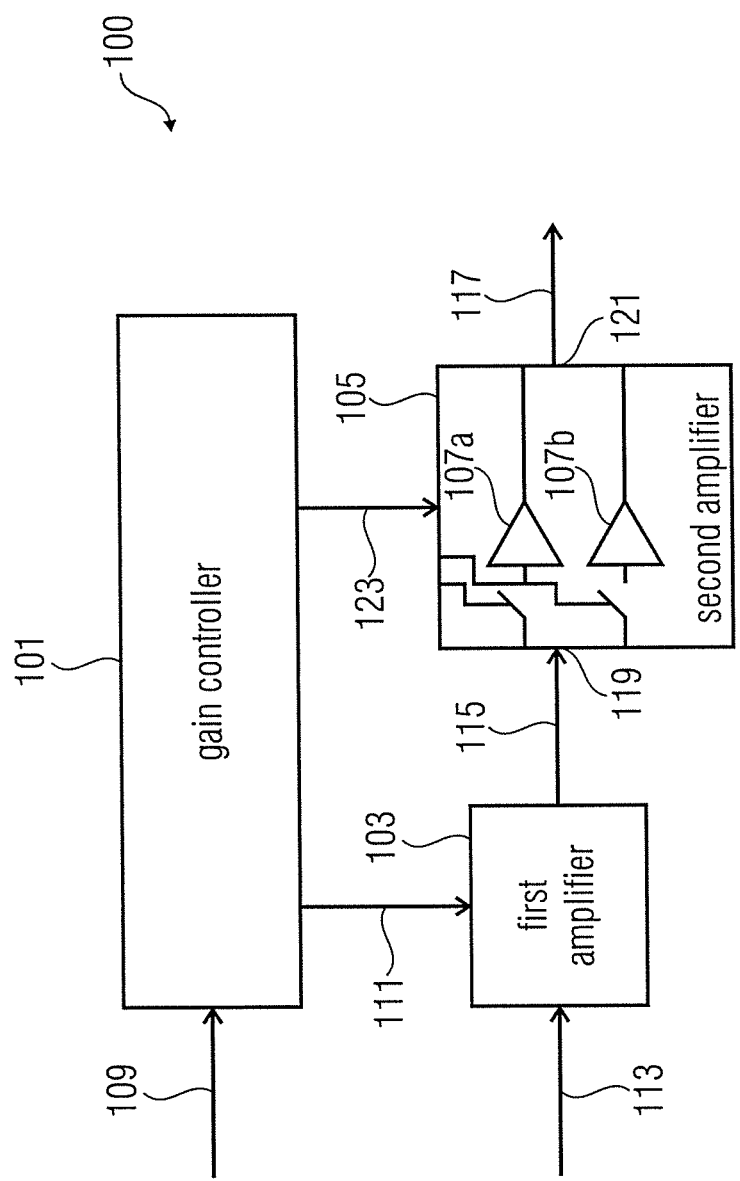
FIG. 1b shows a block schematic diagram of an amplifier circuit.

FIG. 1b shows an exemplary amplifier circuit 100.

The amplifier circuit 100 comprises a gain controller 101, a first amplifier 103 and a second amplifier 105. The second amplifier 105 is coupled in series to the first amplifier 103. Furthermore, the second amplifier 105 comprises a plurality of amplifying units 107a, 107b.

The gain controller 101 is configured to receive a desired gain value 109 and provide, based on the desired gain value 109, a gain adjust signal 111 to the first amplifier 103. Furthermore, the gain controller 101 is configured to activate, based on the received desired gain value 109, a certain combination of amplifying units 107a, 107b of the plurality of amplifying units 107a, 107b of the second amplifier 105, such that a combined gain of the first amplifier 103 and the active amplifying units 107a, 107b of the second amplifier 105 corresponds to (e.g. equals) the received desired gain value 109.

An improved gain adjustment of an amplifier circuit can be achieved, when a first amplifier is used in conjunction with a second amplifier, wherein the second amplifier comprises a plurality of amplifying stages which can be activated and deactivated by a gain controller based on a desired gain value. By using the combination of the first amplifier 103 and the second amplifier 105, as an example, it can be achieved that a relationship between the gain adjust signal 111 and a gain of the first amplifier 103 is linear. In contrast to this, the amplifying unit 107a, 107b of the second amplifier 105 can be implemented such that an amplifying unit 107a, 107b has a fix (non-adjustable) gain. By having the plurality of amplifying units 107a, 107b which can be activated and deactivated a broad range of gain values can be achieved when compared to a continuous (and linear) approach. Nevertheless, by activating and deactivating amplification units of the second amplifier 105 discontinuities between different possible gain values of the second amplifier 105 occur. By having the first amplifier 103 coupled in series with the second amplifier 105 also gain values between the discrete gain steps can be achieved, as the first amplifier 103 offers a continuous gain adjustment (without discrete gain steps). Hence, the amplifying circuit 100 provides a continuous gain adjustment over a large range of gain values.

Furthermore, the amplifying circuit 100 comprises the following additional features.

The first amplifier 103 is configured to receive a first amplifier input signal 113 (which is also an input signal 103 of the amplifier circuit 100). Furthermore, the first amplifier 103 is configured to apply a first gain to the received first amplifier input signal 113 based on the gain adjust signal 111. Furthermore, the first amplifier 103 is configured to provide a second amplifier input signal 115 to the second amplifier 105. The second amplifier input signal 115 is an amplified version of the first amplifier input signal 113. The first amplifier 103 may be a digital amplifier (such as a digital multiplier). Hence, the first amplifier input signal 113 may be a digital signal. The second amplifier 105 may be an analog amplifier configured to receive the second amplifier input signal 115 as an analog signal. The amplifying circuit 100 may comprise a digital-to-analog converter coupled between the first amplifier 103 and the second amplifier 105 which is configured to convert the second amplifier input signal 115 from the digital domain (as provided by the first amplifier 103) to the analog domain (as received by the second amplifier 105).

The second amplifier 105 is configured to apply a second gain to the received second amplifier input signal 105 to derive an amplifier circuit output signal 117 (also designated as output signal 117). The second gain applied by the second amplifier 105 is a sum of the gains applied by the activated amplification units 107a, 107b of the second amplifier 105.

The combined gain of the amplifier circuit 100 (which could also be designated as the overall gain of the amplifier circuit 100) is the gain difference between the first amplifier input signal 113 and the amplifier circuit output signal 117.

Furthermore, each of the amplifying units 107a, 107b is a discrete amplifying unit, which means that in an activated state this amplifying unit applies a gain to a signal received at its input and that this amplifying unit omits applying the gain to the signal received at its input in the deactivated state.

Furthermore, a gain applied by an amplifying unit 107a, 107b may be non-adjustable (i.e., fixed).

Nevertheless, different amplifying units 107a, 107b can comprise different gains. As just an example, the gains applied by the amplifying units 107a, 107b can be binary scaled.

Furthermore, at least some of the plurality of amplifying units 107a, 107b of the second amplifier 105 are coupled in parallel between an input 119 and an output 121 of the second amplifier 105. Although in the example in FIG. 1b the second amplifier 105 only comprises two amplifying units 107a, 107b, the number of amplifying units in the second amplifier 105 can vary and depends on the number of desired discrete gain steps which should be provided by the second amplifier 105.

Figure 4A:
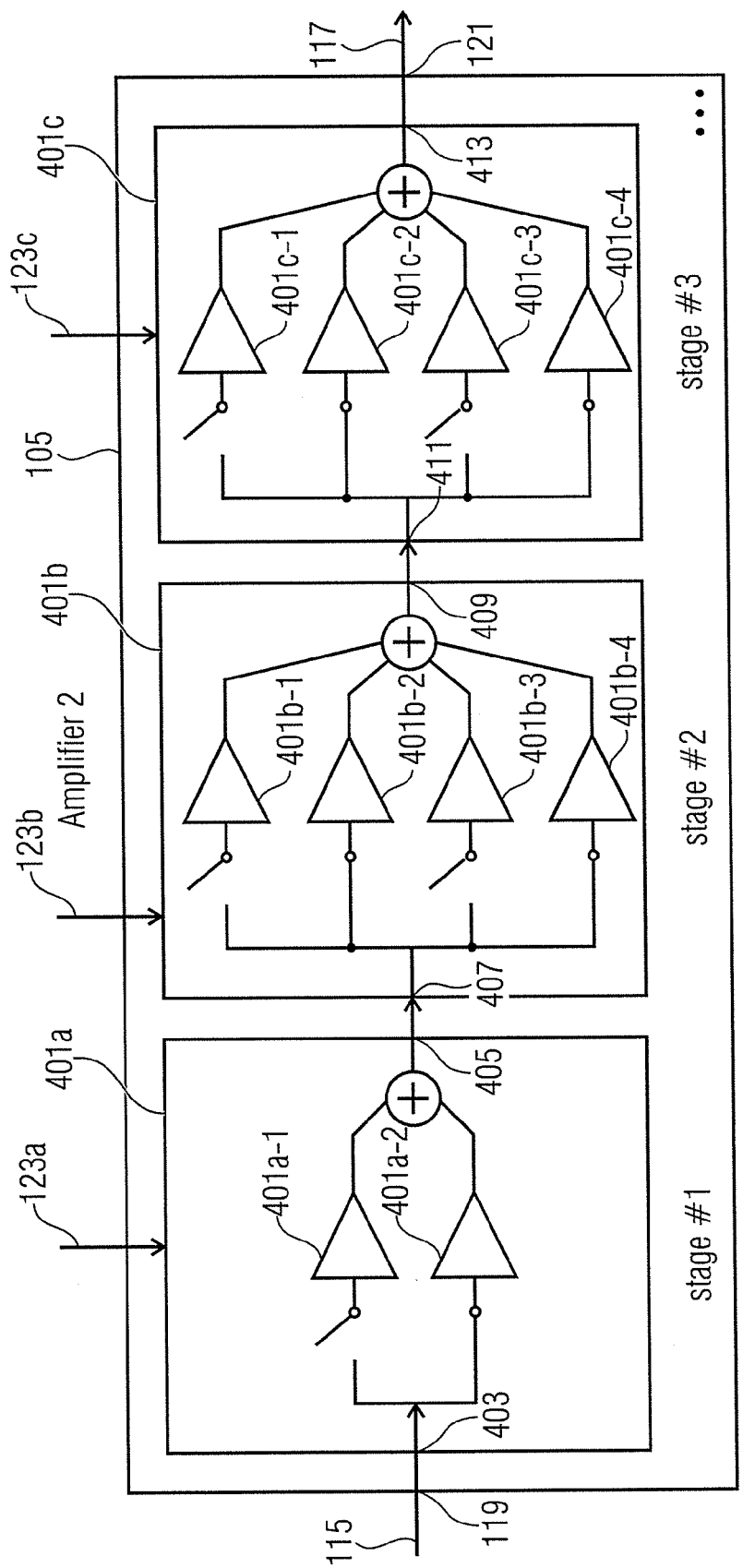
FIG. 4a shows a block schematic diagram of an exemplary implementation of a second amplifier of an amplifier circuit.

As will be shown in conjunction with FIG. 4a, the second amplifier 105 can comprise a plurality of amplifying stages, which are coupled in series between the input 119 and the output 121 of the second amplifier 105. Each of these amplifying stages can comprise a plurality of amplifying units 107a, 107b which are coupled in parallel between an input and an output of the respective amplifying stage.

As an example shown in FIG. 1b, the gain controller 101 can be configured to provide a switch code 123 to the second amplifier 105 indicating which of the amplifying units 107a, 107b of the second amplifier 105 has to be activated. Furthermore, in the case of having a plurality of amplifying stages the gain controller 101 can be configured to provide to each amplifying stage a dedicated switch code indicating the amplifying units of the amplifying stage to be activated.

The gain controller 101 may be configured to provide the switch code 123 or the switch codes based on the desired gain value 109.

Figure 2A:
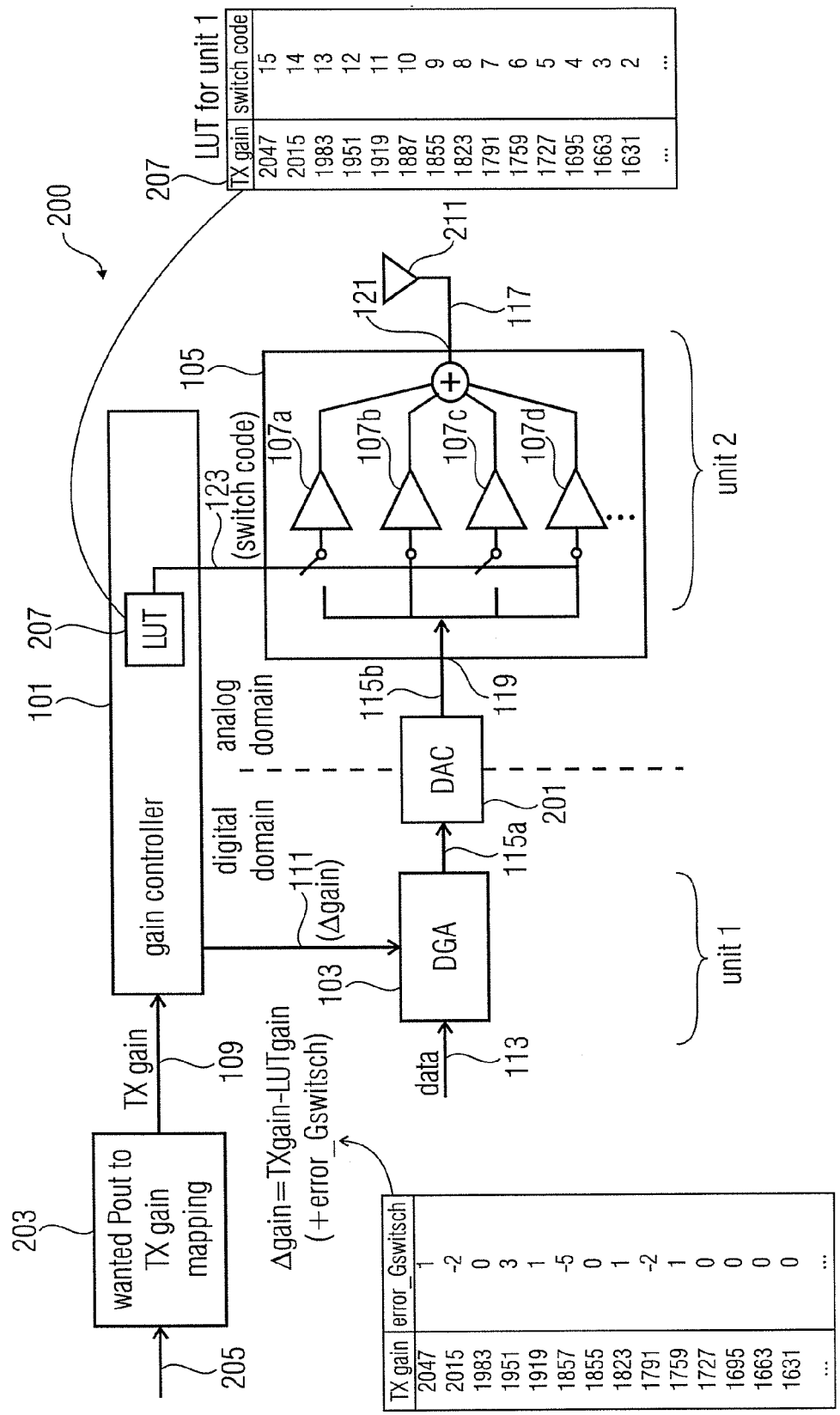
FIGS. 2a and 2b show block diagrams of exemplary implementations of the amplifier circuit shown in FIG. 1b.

FIG. 2a shows another exemplary amplifier circuit 200.

The amplifier circuit 200 differs from the amplifier circuit 100 shown in FIG. 1b in that it additionally comprises a digital-to-analog converter 201 which is coupled between the first amplifier 103 and the second amplifier 105. Hence, in FIG. 2a it can be seen that the first amplifier 103 is configured to provide the second amplifier input signal 115 in the digital domain (e.g. as digital signal 115a) and the second amplifier 105 is configured to receive the first amplifier input signal in the analog domain (e.g. as an analog signal 115b). The digital analog converter 201 is configured to convert the digital signal 115a into the analog signal 115b.

Furthermore, the first amplifier 103 is a digital gain amplifier (DGA). As an example, the digital gain amplifier 103 is configured to multiply the first amplifier input signal 113 by the gain adjust signal 111 provided from the gain controller 101 to derive the digital signal 115a (the first amplifier input signal 115 in the digital domain).

Furthermore, the receiver 200 comprises a power to gain mapper 203. The power to gain mapper 203 is configured to receive a power control value 205 indicating a desired output power and to provide based on the power control value 205 the desired gain value 109 (also designated as TX_Gain). As an example, the received power control value 205 may be based on a power adjust command received from a base station communicating with a mobile communication device comprising the amplifier circuit 200.

Hence, the amplifier circuit 200 adjusts, based on this power control value 205, its combined gain by adjusting the gain of the first amplifier 103 and the second amplifier 105 such that a resulting output power at the output 121 of the second amplifier 105 corresponds to the desired output power indicated by the power control value 205.

By having the first amplifier 103 in series with the second amplifier 105 a very linear relationship between the (output) power control value 205 and the achieved output power of the output signal 117 at the output 121 of the second amplifier 105 is achieved.

Exemplary implementations for the power gain mapper will be provided in conjunction with the FIGS. 3 to 5d.

Furthermore, the second amplifier 105 comprises, in one embodiment, four amplifying units 107a-107d, nevertheless, as already pointed out, the number of amplifying units in the second amplifier 105 can vary.

Furthermore, the gain controller 101 comprises a lookup table 207 which comprises for each desired gain value an associated value of the switch code 123.

Different values for the switch code 123 are associated with different combinations of amplifying units 107a-107d to be activated.

As can be seen from FIG. 2a it is not necessary to provide a table entry per possible value of the desired gain value 109 in the look up table 207. It is sufficient to provide a table entry for the values of the desired gain value 109 for which a state of the second amplifier 105 (e.g. the number of activated amplifying units 107a-107d) is to be changed and therefore for which the value of the switch code 123 is to be changed. Hence, each value of the switch code 123 can correspond to a predetermined range of (succeeding) values of the desired gain value 109.

Furthermore, the output 121 of the second amplifier 105 is coupled to an antenna 211 (which may be external to the RF receiver 200).

Each of the amplifying units 107a-107d is configured to apply in an activated state a corresponding gain to the analog signal 115b (the second amplifier input signal 115 in the analog domain) received at the input 119 of the second amplifier 105. Furthermore, a second amplifier gain applied by the second amplifier 105 to the analog signal 115b is a sum of the corresponding gains of the activated amplifying units 107a-107d of the second amplifier (wherein the combination of activated amplifying units 107a-107d is determined by the switch code 123).

Each of the amplifying stages 107a-107b is a discrete unit (discrete in the meaning of can be activated independently of the other amplifying units 107a-107d). Each of these discrete stages is configured to apply, in an activated state, a corresponding gain to the to the analog signal 115b received at the input 119 of the second amplifier 105 and omit, in a deactivated state, applying the corresponding gain to the to the analog signal 115b.

As an example, in a deactivated state of an amplifying unit 107a-107d, the deactivated amplifying unit 107a-107d is bypassed.

Furthermore, the corresponding gain of each amplifying unit 107a-107d may be non-adjustable or fixed. Furthermore, all of the amplifying units 107a-107d may be configured to apply the same corresponding gain to the analog signal 115b.

Furthermore, at least some of the amplifying units 107a-107d may differ in the corresponding gain they apply to the analog signal 115b. As an example, the corresponding gains of the amplifying units 107a-107d may be binary scaled with respect to one another. Furthermore, as can be seen from FIG. 2a, the first amplifier 103 is a digital amplifier 103 which is configured to amplify the first amplifier input signal 113 based on the gain adjust signal 111.

Figure 2B:
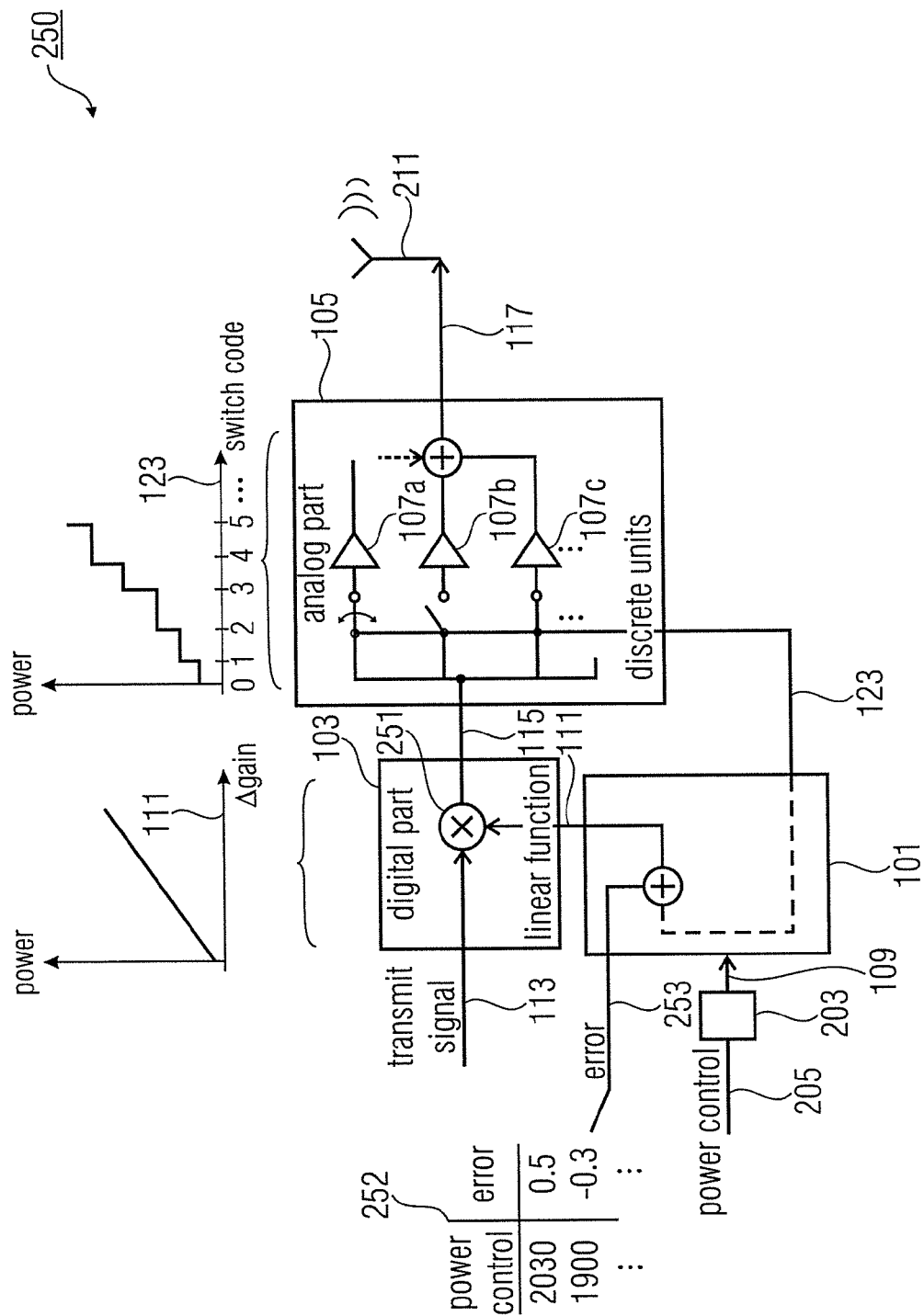

FIG. 2b shows a block schematic diagram of another exemplary amplifier circuit 250. The amplifier circuit 250 differs from the amplifier circuit 200 shown in FIG. 2a in that an exemplary implementation of the first amplifier 103 is shown.

The amplifier 103 comprises a digital multiplier 251 which is configured to multiply the first amplifier input signal 113 (also designated as digital data signal 113, transmit signal 113 or input signal 113) with the gain adjust signal 111 to derive the digital signal 115a (the second amplifier input signal 115 in the digital domain).

As can be seen from FIG. 2b, the relationship between the gain adjust signal 111 and the resulting power of the second amplifier input signal 115 is a linear relationship. Such a linear relationship can easily be calculated using the digital multiplier 103.

Furthermore, the gain controller 101 comprises a discontinuity compensation lookup table 252 in which for each desired gain value (and therefore for each desired output power of the output signal 117) a discontinuity compensation value 253 (also designated as error) is provided. The gain controller 101 is configured to derive the gain adjust signal 111 furthermore based on the discontinuity compensation value 253 provided in the discontinuity compensation lookup table 252 for the desired gain value 119 or desired output power of the output signal 117.

By having the discontinuity compensation discontinuities in the output power versus power control, characteristics can be eliminated such that the resulting relationship between the power control value 205 indicating the desired output power of the output signal 117 and the resulting output power of the output signal 117 is a linear relationship (without discontinuities).

More details on the discontinuity compensation are also shown in FIGS. 6a-6e.

Figure 3A:
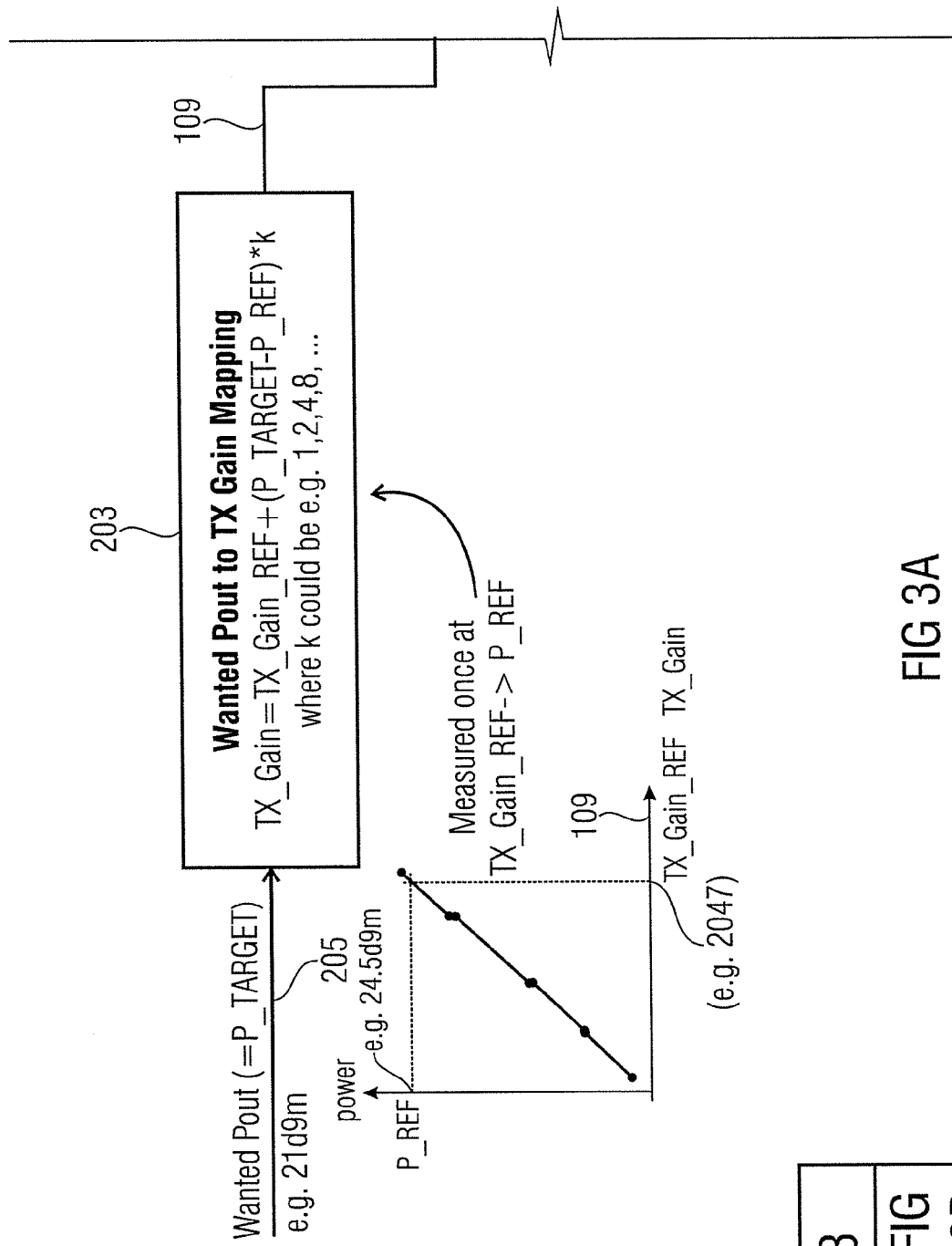
FIG. 3 shows a block schematic diagram of an exemplary implementation of a power to gain mapper and a gain controller in an amplifier circuit.

FIG. 3 shows a block schematic diagram of an exemplary implementation for the power to gain mapper 203 and the gain controller 101 how they can be used in an exemplary amplifier circuit.

The power to gain mapper 203 receives the power control value 205 indicating the desired output power of the output signal 117 and derives, based on the power control value 205, the desired gain value 109.

The power to gain mapper 203 comprises an amplifier circuit specific calibration pair of a reference gain value (TX_Gain_REF) and a resulting reference output power (P_REF) of the amplifying circuit in which the power to gain mapper 203 is used (for example of the amplifying circuit 200, 250). The power to gain mapper 203 is configured to derive the desired gain value 109 further based on this calibration pair. The resulting reference output power at the amplifying circuit is measured in a calibration process of the amplifying circuit once and stored in the power to gain mapper 203. Hence, the meaning of amplifier circuit specific is that different amplifier circuits can comprise different resulting reference output powers for the same reference gain value (e.g. resulting from process variations).

In other words, it is sufficient to derive for one reference gain value the resulting reference output power which is then stored in the power to gain mapper 203. The desired gain value 109 (TX_Gain) can be derived based on the following formula:

$$TX\_Gain = TX\_Gain\_REF + (P\_TARGET - P\_REF) * k,$$

wherein k could be, for example, 1, 2, 4, 8, ... and wherein P_TARGET equals the desired output power of the output signal 117 indicated by the power control value 205.

Furthermore, the gain controller 101 is configured to derive the gain adjust signal 111 (in the logarithmic domain) based on the following formula:

$$Gain\_Adj\_1 = TX\_Gain - Gain\_Switch(+ error\_Gswitch),$$

wherein Gain_Adj_1 is the gain adjust signal 111 in the logarithmic domain, Gain_Switch equals the sum of the gains of the activated amplifying units 107a-107d of the second amplifier 205, and Error_Gswitch is the discontinuity compensation value 253 provided in the discontinuity compensation lookup table 252 for the desired gain value 109 (TX_gain). The discontinuity compensation is optional.

Furthermore, the gain controller 101 is configured to perform an optional logarithmic to linear conversion to derive the gain adjust signal 111 in the linear domain. Due to the fact that the first amplifier 103 (which is a linear amplifier) can be implemented as a multiplier, the controller 101 is configured to convert the gain adjust signal 111 from dB to linear (or in other words from the logarithmic domain to the digital domain). This dB to linear conversion can be performed using tables (e.g. lookup tables) or using an algorithm.

For the controlling of the second amplifier 105 (of the discrete amplifying units 107a-107d) a flexible, reprogrammable strategy is used which is implemented with tables (e.g. the lookup table 207 and the discontinuity compensation lookup table 252). It should be pointed out that for the lookup table 207 no measurement results are necessary, as it is sufficient to just define for which desired gain value 109 which value of the switch code 123 is to be provided.

The different formulas for deriving the desired gain value 109 and the gain adjust signal 111 may be implemented in hardware or firmware. It is to be pointed out that the discontinuity compensation applied by the gain controller 101 using the discontinuity compensation lookup table 252 is optional and is used for compensating for inaccurate discrete gain steps of the second amplifier 105. These inaccurate gain steps are measured (calibrated) and stored in the discontinuity compensation lookup table 252 before a use of the gain controller 101. As an example, the discontinuity compensation lookup table 252 may be an amplifier specific discontinuity compensation lookup table 252, such as the calibration pair for determining the desired gain value 109.

In other words, the gain controller 101 is configured to derive the gain adjust signal 111 based on the difference between the desired gain value 109 and the sum of the gains of the activated amplifying units 107a-107d (indicated by Gain_Switch) and furthermore based on the discontinuity compensation value 253 provided in the discontinuity compensation lookup table 252 for the desired gain value 109.

FIG. 4a shows a block schematic diagram of an exemplary implementation of the second amplifier 105.

The second amplifier 105 comprises a plurality of amplifying stages 401a, 401b, 401c. The plurality of amplifying stages 401a, 401b, 401c are coupled in series between the input 119 and the output 121 of the second amplifier 105.

Although, in the example of FIG. 4a only three amplifying stages 401a-401c are shown, the number of amplifying stages coupled in series between the input 119 and the output 121 of the second amplifier 105 depends on the number of desired discrete gain steps of the second amplifier 105. Each of the amplifying stages 401a-401c comprise a plurality of amplifying units which are coupled in parallel between an input and an output of the respective amplifying stage 401a-401c. As an example, a first amplifying stage 401a comprises a first amplifying unit 401a-1 and a second amplifying unit 401a-2 which are coupled in parallel between an input 403 and an output 405 of the first amplifying stage 401a. A second amplifying stage 401b comprises four amplifying units 401b-1 to 401b-4 which are coupled between an input 407 and an output 409 of the second amplifying stage 401b. A third amplifying stage 401c comprises four amplifying units 401c-1 to 401c-4 which are coupled in parallel between an input 411 and an output 413 of the third amplifying stage 401c. Each of the amplifying units 401a-1 to 401c-4 can be activated independently of the other amplifying units 401a-1 to 401c-4. Furthermore, each of the amplifying stages 401a-401c is configured to receive a respective switch code 123a-123c from the gain controller 101.

The gain controller 101 provides the switch codes 123a-123c such that in an operation of an amplifying circuit comprising the second amplifier 105 as shown in FIG. 4a, always at least one amplifying unit 401a-1, 401c-4 of each amplifying stage 401a-401c coupled in series between the input 119 and the output 121 of the second amplifier 105 is active.

In other words, the amplifier 105 comprises a plurality of amplifying stages 401a-401c. An input of the first amplifying stage 401a is coupled to the input 119 of the second amplifier 105. The output 405 of the first amplifying stage 401a is coupled to the input 407 of the second amplifying stage 401b.

The output 409 of the second amplifying stage 401b is coupled to the input 411 of the third amplifying stage 401c. The output 413 of the third amplifying stage 401c is coupled to the output 121 of the second amplifier 105.

Figures 2, 4B:
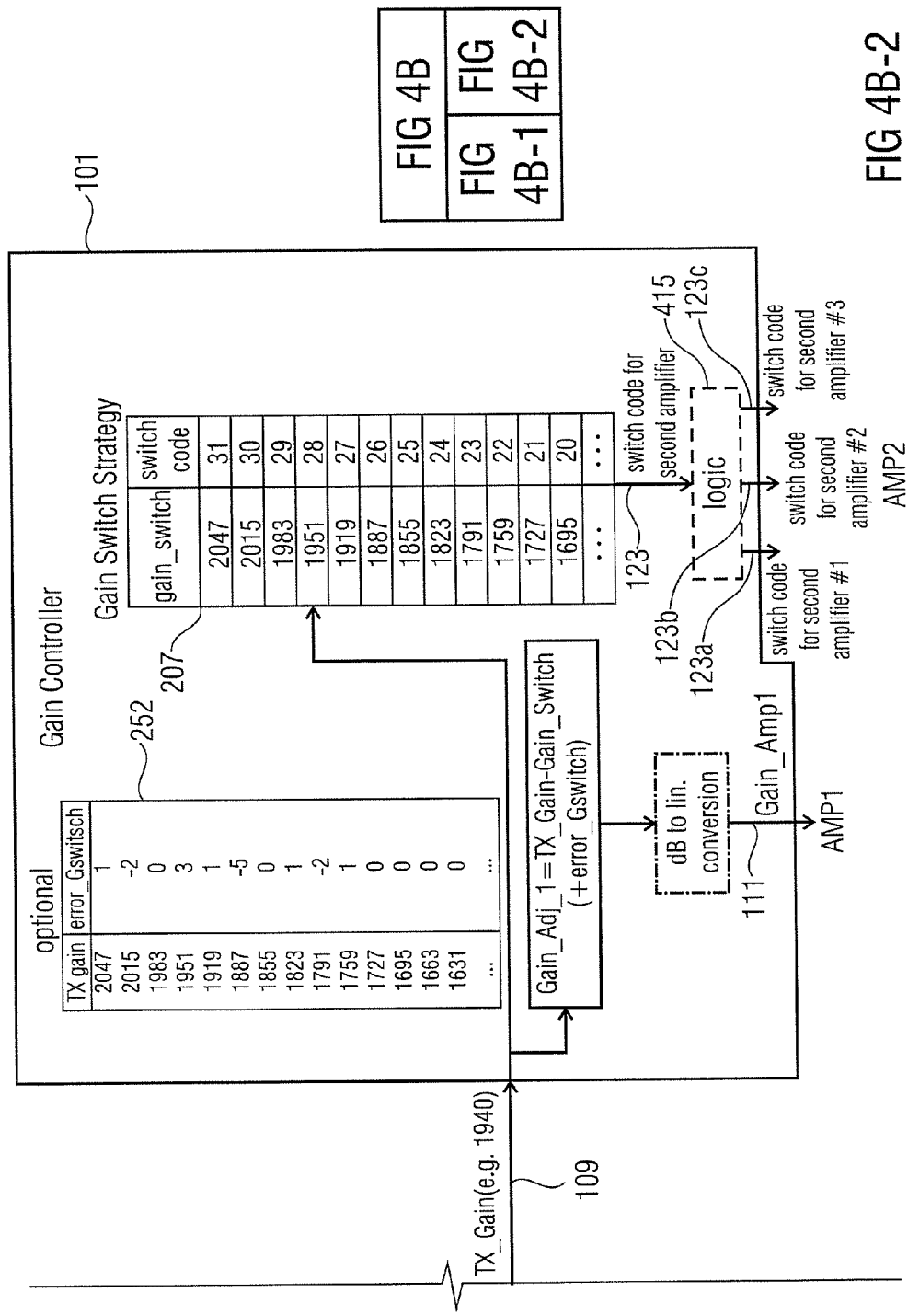

FIG. 4b shows in a block schematic diagram an implementation for the power to gain mapper 203 and the gain controller 101 how they can be used in an amplifying circuit together with the second amplifier 105 shown in FIG. 4a.

The gain controller 101 shown in FIG. 4b differs from the gain controller 101 shown in FIG. 3 in that it further comprises a logic circuit 415 which is configured to derive based on the switch code 123 for the second amplifier 105, a first switch code 123a for the first amplifying stage 401a, a second switch code 123b for the second amplifying stage 101b and a third switch code for the third amplifying stage 401c of the second amplifier 105.

In other words, the logic circuit 415 it is configured to split the switch code 123 for the second amplifier 105 into the plurality of switch codes 123a-123c for the different amplifying stages 401a-401c of the second amplifier 105. The switch codes 123*a*-123*c* may be designated also as digital codes for the amplifying stages 401*a*-401*c* of the second amplifier 105.

Figures 1, 4C:
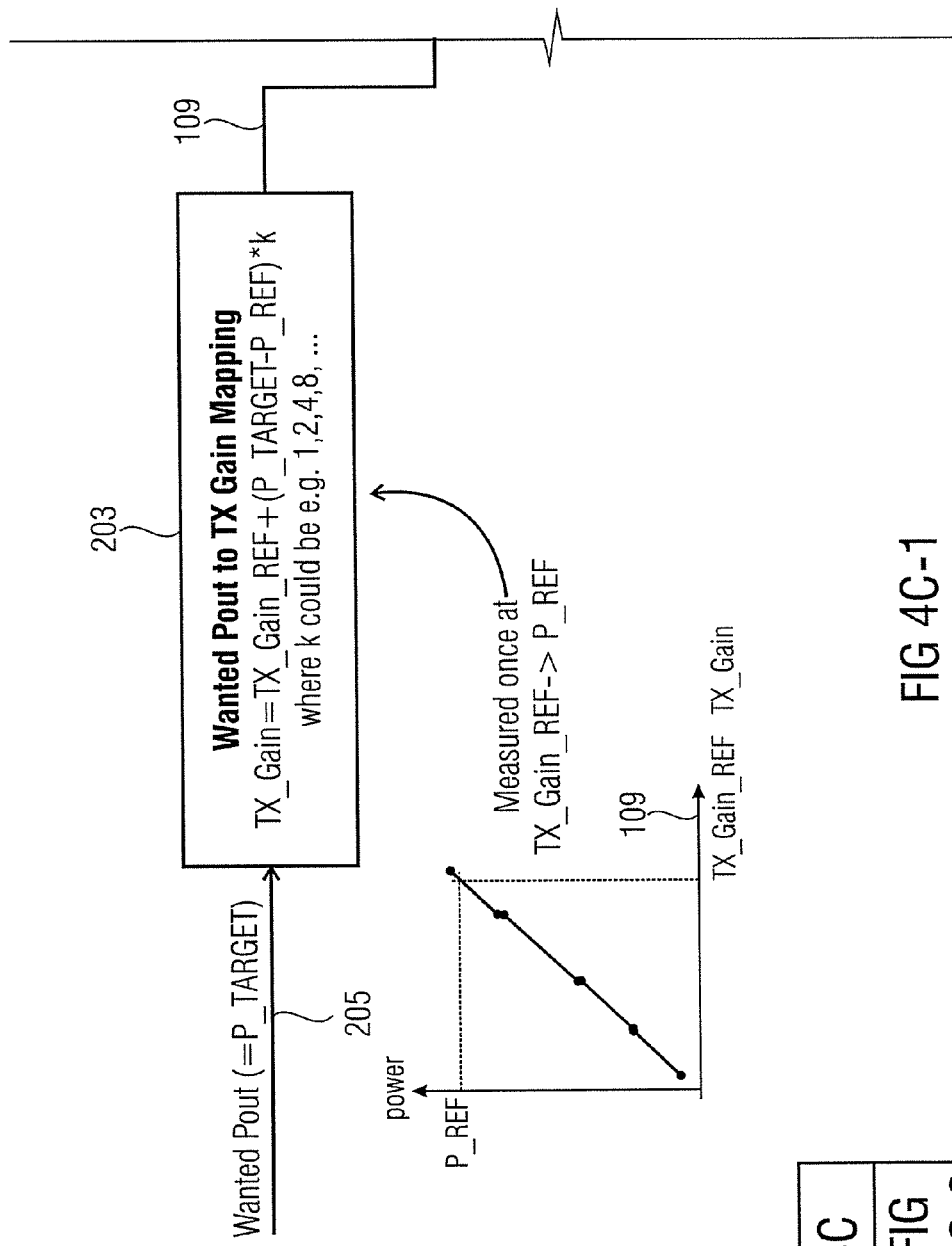

FIG. 4*c* shows in a block schematic diagram another exemplary implementation for the gain controller 101 which is configured to provide the plurality of switch codes 123*a*-123*c*. In this implementation shown in FIG. 4*c* the lookup table 407 comprises for each desired gain value 109 a respective value for each switch code 123*a*-123*c* for each amplifying stage 401*a*-401*c* of the second amplifier 105. Hence, in contrast to the implementation shown in FIG. 4*b*, the logic circuit 415 is not needed anymore, as the lookup table 207 already comprises for each amplifying stage 401*a*-401*c* of the second amplifier 105 for each desired gain value 109 a value for the respective switch code 123*a*-123*c*. In other words, the switch codes 123*a*-123*c* for the separate amplifying stages 401*a*-401*c* are stored separately in the lookup table 207.

As can be seen from FIG. 4*c* for different values of the desired gain value 109 the same values for the switch codes 123*a*-123*c* can be provided. As an example, for the values 1920 to 1951 of the desired gain value 109 the first switch code 123*a* has the value 30, the second switch code 123*b* has the value 7 and the third switch code has the value 14. Hence each value of the switch code 123*a*-123*c* may correspond to a predetermined range of values of the desired gain value 109. Hence, in the look up table 207 it is not necessary to have for every possible value of the desired gain 109 a table entry. It is sufficient to have table entries provided for values of the desired gain 109 for which a state of the second amplifier 105 (i.e. the number of activated amplifying units) is to be changed and therefore for which at least one value of one of the switch codes 123*a*-123*c* is to be changed.

Figures 2, 4D:
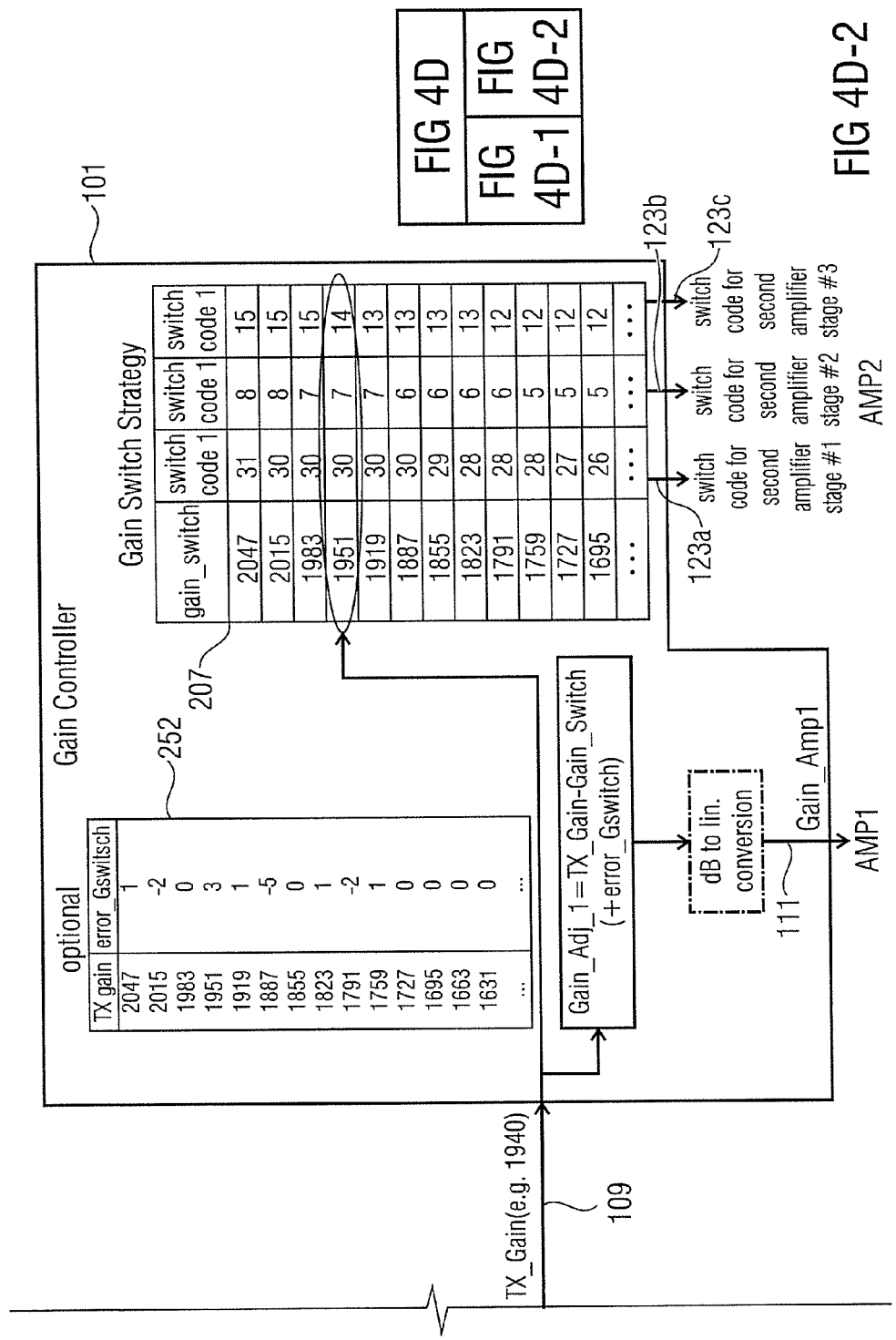

FIG. 4*d* shows in a block schematic diagram a further exemplary implementation for the power to gain mapper 203 and the gain controller 101. The implementation shown in FIG. 4*d* differs from the implementations shown in FIG. 4*c* in that the power to gain mapper 203 is further configured to derive the desired gain value 109 based on environmental conditions of the amplifying circuit in which the power to gain mapper 203 is used.

In detail the power to gain mapper 203 derives the desired gain value 109 furthermore based one or more environmental condition(s) such as a power amplifier bias change, temperature of the amplifier circuit, frequency of the first amplifier input signal 113 and supply voltage (such as battery voltage). The power to gain mapper 203 can be configured to derive the desired gain value 109 based on at least one of these environmental conditions. As an example, the power to gain mapper 203 is configured to, based on the current environmental condition (e.g. a combination of the bias voltage of the amplifier circuit, the temperature of the amplifier circuit, the supply voltage of the amplifier circuit and the frequency of the first amplifier input signal 113) choose a compensation value out of a plurality of (stored) compensation values and derive the desired gain value 109 further based on this chosen compensation value.

As an example, the power to gain mapper 203 shown in FIG. 4*d* derives the desired gain value 109 based on the following formula:

$$TX\_Gain = TX\_Gain\_REF + (P\_TARGET - P\_REF)*k + COMP,$$

wherein COMP is the compensation value (e.g. power amplifier bias or power amplifier bias change, temperature, frequency, battery voltage or supply voltage).

The compensation value COMP may be a sum of different compensation values, wherein each of the different compensation values corresponds to one of the environmental conditions. The compensation values or the different compensation values for the different environmental conditions can be derived, for example, based on one or more lookup table(s) or based on formulas. Each compensation value can be derived in conjunction with the amplifier specific calibration pair, as the determination of the calibration pair happens at a certain biasing point (for a given power amplifier setting, temperature, battery voltage and frequency) of the amplifier circuit, which enables that the variations of these parameters can be regarded in the determination of the desired gain value 109.

Figure 5A:
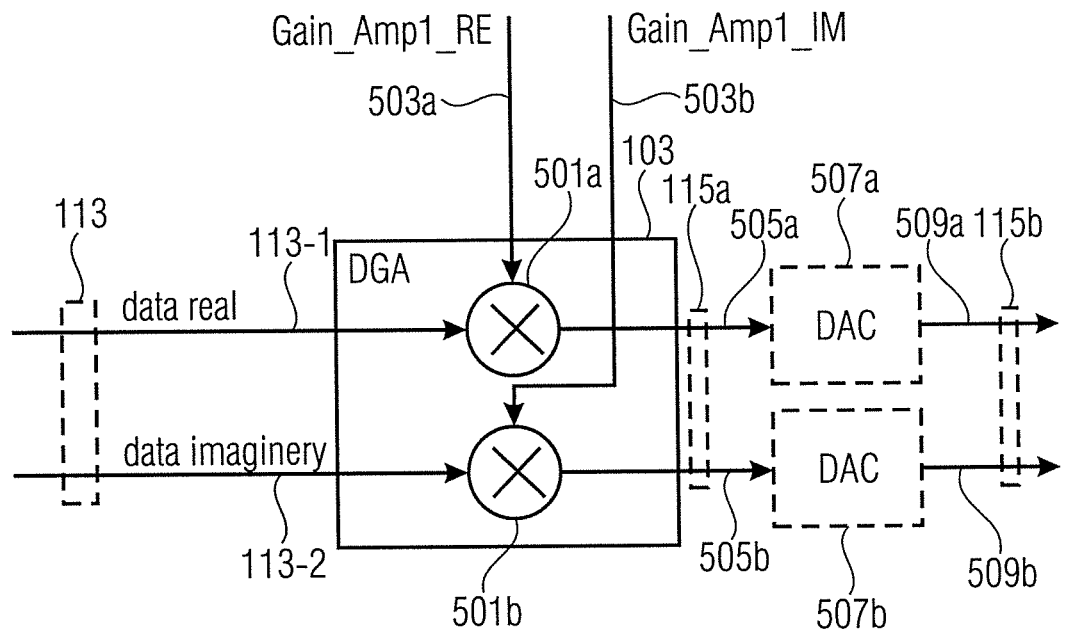
FIG. 5a shows in a block schematic diagram of an exemplary implementation for a first amplifier and how it can be used in an amplifier circuit.
Figure 5B:
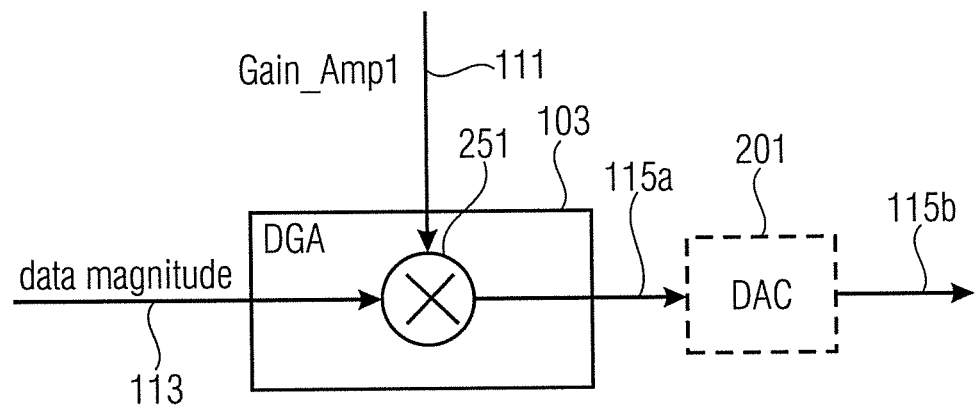
FIG. 5b shows another exemplary implementation of the first amplifier.

FIGS. 5*a* and 5*b* show exemplary implementations for the first amplifier 103, which are based on the assumption that a transmit signal to be amplified by the amplifying circuit is a complex signal which can be represented by a real part and an imaginary part or by a magnitude part (or amplitude part) and a phase part. FIG. 5*a* shows how the first amplifier 103 can be implemented if the transmit signal is represented by a real part and an imaginary part. In this case the first amplifier input signal 113 equals the transmit signal. FIG. 5*b* shows how the first amplifier 103 can be implemented if the transmit signal is represented by a magnitude part and a phase part. In this case the first amplifier input signal 113 equals the magnitude part of the transmit signal, as only this part needs to be amplified.

FIG. 5*a* shows an implementation in which the first amplifier 103 is configured to apply a first gain to a real part 113-1 of the first amplifier input signal 113 and a second gain to an imaginary part 113-2 of the first amplifier input signal 113. Hence, the first amplifier 103 shown in FIG. 5*a* comprises a first multiplier 501*a* and a second multiplier 501*b*. The first multiplier 501*a* and the second multiplier 501*b* are digital multipliers. The first multiplier 501*a* is configured to receive a first gain adjust signal 503*a* (also designated as Gain_Amp1_RE) and multiply the first gain adjust signal 503*a* with the real part 113-1 of the first amplifier input signal 113 derive a first multiplier output signal 505*a*. The second multiplier 501*b* is configured to receive a second gain adjust signal 503*b* (also designated as Gain_Amp1_IM) and multiply the second gain adjust signal 503*b* with the imaginary part 113-2 of the first amplifier input signal 113 to derive a second multiplier output signal 505*b*.

The first multiplier output signal 505*a* forms a real part of the digital signal 115*a* (the second amplifier input signal 115 in the digital domain) and the second multiplier output signal 505*b* forms an imaginary part of the digital signal 115*a* (the second amplifier input signal 115 in the digital domain).

If the first amplifier 103 shown in FIG. 5*a* is implemented in the amplifying circuit of FIG. 2*a*, the digital-to-analog converter 201 comprises a first digital-to-analog conversion stage 507*a* and a second digital-to-analog conversion stage 507*b*. The first digital-to-analog conversion stage 507*a* is configured to convert the first multiplier output signal 505*a* from the analog domain to the digital domain to derive a first analog output signal 509*a*.

The second digital-to-analog conversion stage 507*b* is configured to convert the second multiplier output signal 505*b* from the digital domain to the analog domain to derive a second analog output signal 509*b*.

The first analog output signal 509*a* forms a real part of the analog signal 115*b* (the second amplifier input signal 115 in the analog domain) and the second analog output signal 509*b* forms an imaginary part of the analog signal 115*b* (the second amplifier input signal 115 in the analog domain).

In other words, the first amplifier 103 as shown in FIG. 5*a* is configured to adjust the first gain for the real part 113-1 of the first amplifier input signal 113 independently of the second gain applied to the imaginary part 113-2 of the first amplifier input signal 113.

As an example, each of the multipliers 501a, 501b may be implemented as a 12×12 bit multiplier (the gain adjust signals 503a, 503b may have 12 bits and the real part 113-1 and the imaginary part 113-2 of the first amplifier input signal 113 may have 12 bits). Furthermore, the first amplifier input signal 113 is provided to the first amplifier 103 as a first stream of digital data comprising the real part 113-1 of the first amplifier input signal 113 and a second stream of digital data comprising the imaginary part 113-2 of the first amplifier input signal 113.

FIG. 5b shows another exemplary implementation of the first amplifier 103, in which a single multiplier is sufficient. As already mentioned, this implementation of the first amplifier 103 can be used in an amplifier circuit which is configured to receive the amplifier input signal 113 as a magnitude part of a transmit signal. Hence, the first amplifier 103 comprises a multiplier 251 which is configured to multiply the first amplifier input signal 113 by the gain adjust signal 111 to derive the digital signal 115a (the second amplifier input signal 115a in the digital domain).

Furthermore, the digital-to-analog converter 201 is shown which is configured to convert the second amplifier input signal 115 from the digital domain to the analog domain.

Furthermore, the amplifier input signal 113 may be a transmit signal which is represented by the real part 113-1 and the imaginary part 113-2 or may be a magnitude part of the transmit signal.

The gain adjust signal 111, 503a, 503b therefore can adjust the level of the magnitude of the transmit signal or the levels of the real part 113-1 and the imaginary part 113-2 of the transmit signal.

Figures 1, 5C:
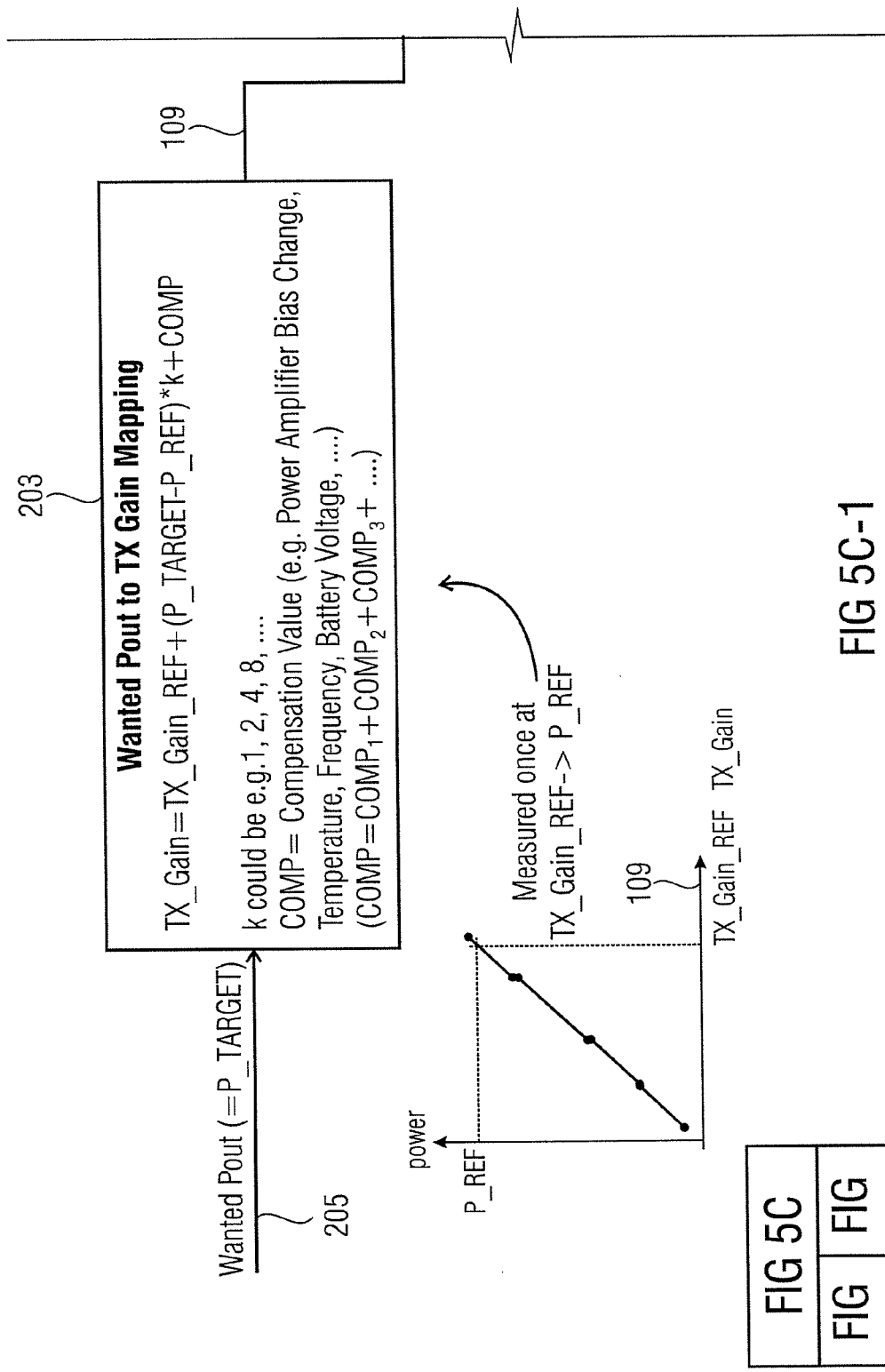
Figures 2, 5C:
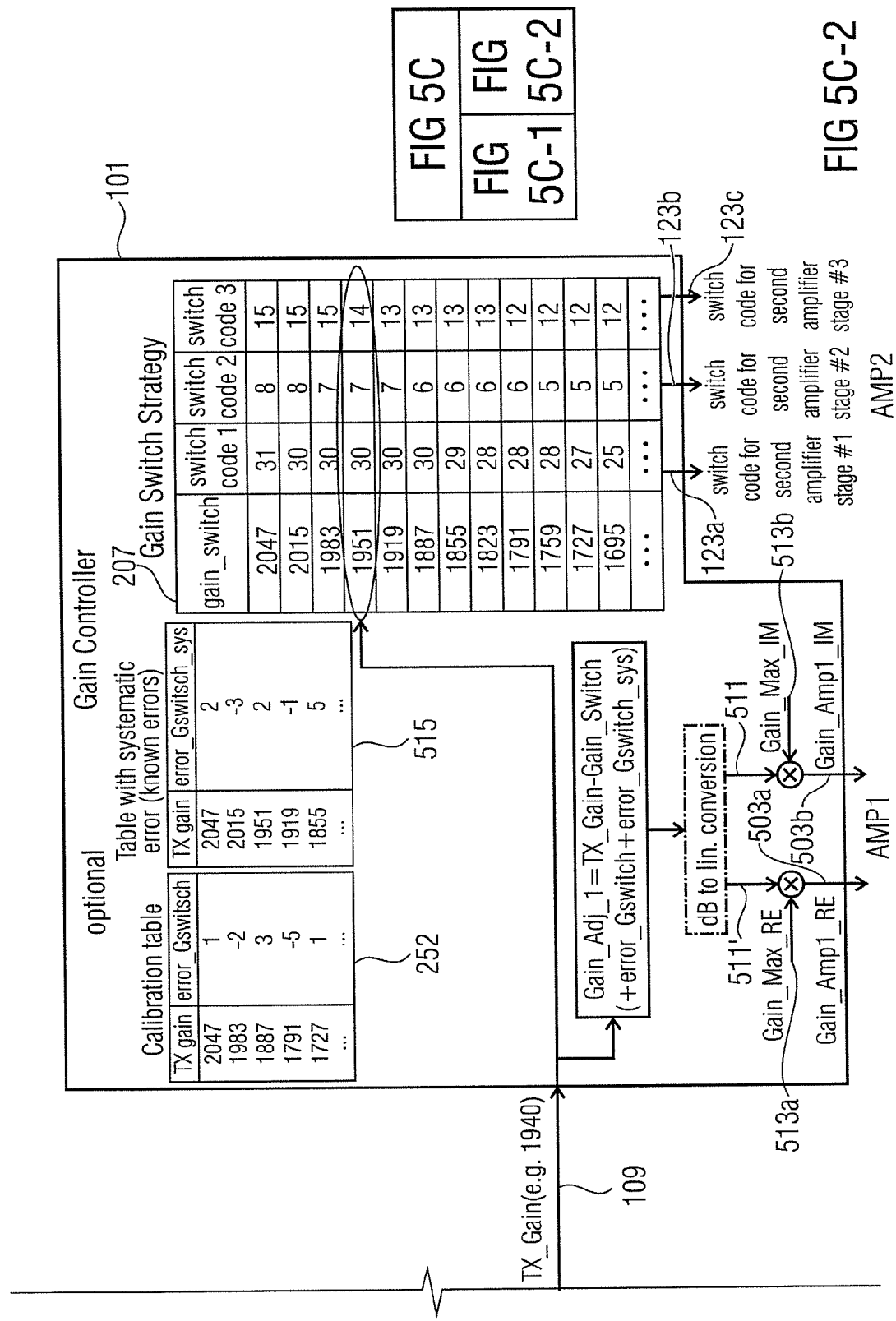

FIG. 5c shows in a block schematic diagram an exemplary implementation of the power to gain mapper 203 and the gain controller 101 which can be used in conjunction with the first amplifier 103 as shown in FIG. 5a. Hence, the gain controller 101 is configured to provide the first gain adjust signal 503a for adjusting the first gain applied to the real part 113-1 of the first amplifier input signal 113 and provide the second gain adjust signal 503b for adjusting the second gain applied to the imaginary part 113-2 of the first amplifier input signal 113. As can be seen from FIG. 5c, the gain controller 101 is configured to derive based on the desired gain value 109 a base gain adjust signal 511 and scale the base gain adjust signal 511 by a first scaling factor 513a (or designated as Gain_Max_RE) to derive the first gain adjust signal 503a. Furthermore, the gain controller 101 is configured to scale the base gain adjust signal 511 by a second scaling factor 513b (also designated as Gain_Max_IM) to derive the second gain adjust signal 503b.

The first scaling factor 513a can be different from the second scaling factor 513b. Hence, the first gain adjust signal 503a can differ from the second gain adjust signal 503b.

In other words, the gain controller 101 is configured to vary the first gain adjust signal 503a and the second gain adjust signal 503b individually.

FIG. 5c shows the implementation of the gain controller 101 in which the base gain adjust signal 511 is scaled after the dB to linear conversion before the level of the transmit signal is adjusted in the first amplifier 103.

Furthermore, FIG. 5c shows an exemplary implementation of the gain controller 101 in which the gain controller 101 is further configured to compensate for systematic errors. For this the gain controller 101 comprises a systematic error lookup table 515 in which for each desired gain value 109 a respective systematic error compensation value (error_G-switch_sys) is provided. The gain controller 101 is therefore configured to further derive the gain adjust signals 503a, 503b based on the systematic error compensation value for the desired gain value 109. As an example, the base gain adjust value 511 may be derived based on the following formula:

$$\text{Gain\_Adj\_1} = TX\_\text{Gain} - \text{Gain\_Switch}(+\text{error\_}G\text{switch} + \text{error\_}G\text{switch\_sys}),$$

wherein Gain_Adj_1 represents the base gain adjust value 511 in the logarithmic domain.

Hence, FIG. 5c shows an implementation of the gain controller 101 in which systematic inaccuracies (which means same behavior for all amplifier circuits) are added in the formula for deriving the base gain adjust signal 511. Such systematic errors can be stored once in the integrated circuit (e.g. in the systematic error lookup table 515) and don't need a calibration process.

Although the systematic error compensation is shown in conjunction with the gain controller 101 in FIG. 5c, such systematic error compensation may be also implemented in other the gain controllers presented in this application.

If the gain steps of the amplifying units of the second amplifier 205 are precise enough, the calculation of the gain adjust signal 111 or the gain adjust signals 503a, 503b can be done very easy and the calibration efforts can be kept low.

In general, the implementation of the gain controllers can be done in hardware, firmware or in both.

Figures 1, 5D:
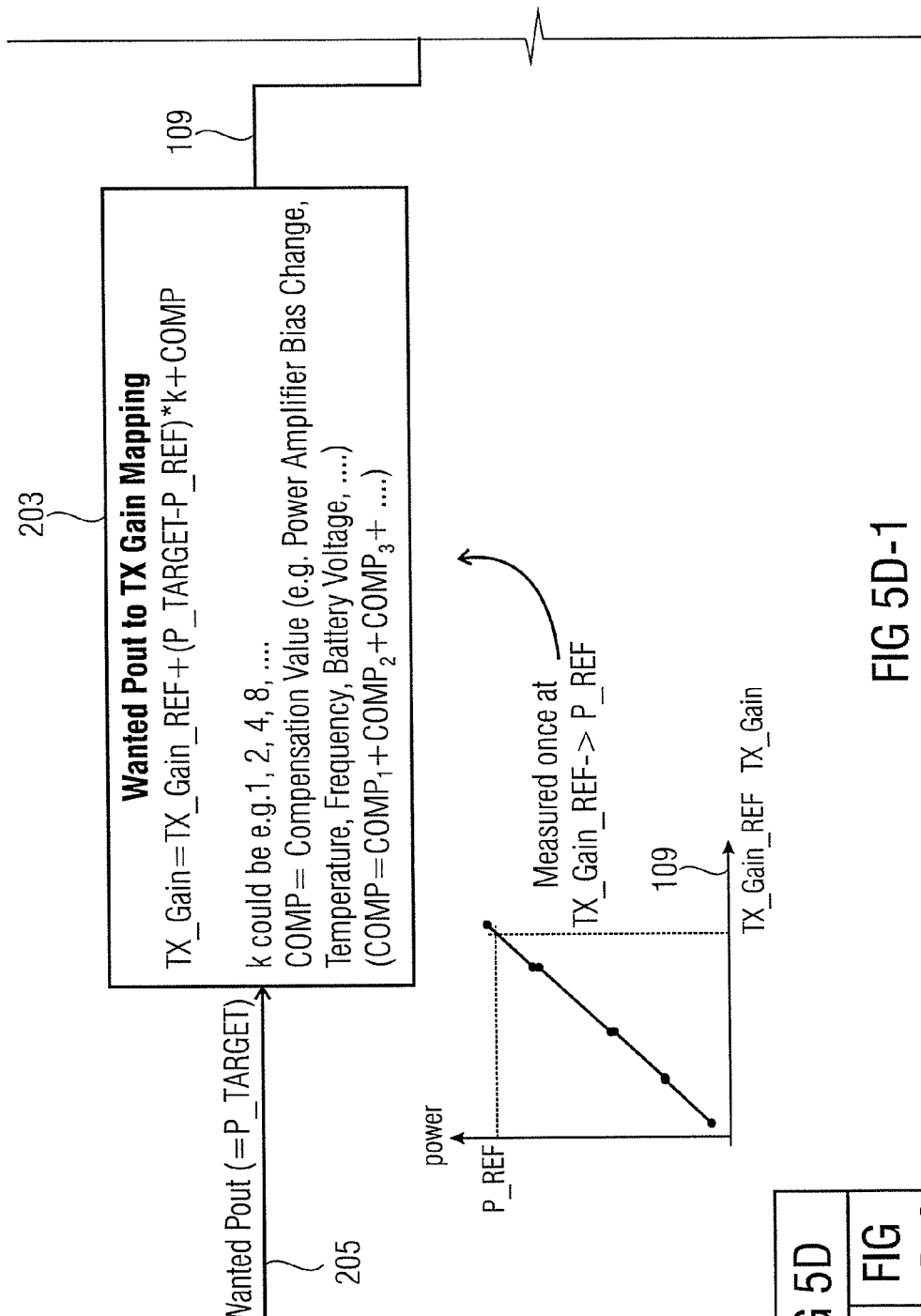
FIG. 5d shows in block schematic diagram an exemplary implementation of a power to gain mapper and a gain controller which may be used in the amplifier circuit comprising the first amplifier shown in FIG. 5b.

FIG. 5d shows in a block schematic diagram another exemplary implementation for the power to gain mapper 203 and the gain controller 101 which differs from the implementation shown in FIG. 5c in that the gain controller 101 is configured to provide the gain adjust signal 111 to the first amplifier 103 shown in FIG. 5b. The gain controller 101 is configured to derive, based on the desired gain value 109, the base gain adjust signal 511 and is configured to scale the base gain adjust signal 511 by a scaling factor 513 (also designated as Gain_Max) to derive the gain adjust signal 111 for the first amplifier 103.

In the following, it will be described how the amplifier circuits described herein enable a power adjustment strategy with very linear segments of the power characteristic course (output power versus power control parameter or value). An advantage is that these linear segments of the course stay constant. Only the points of discontinuity can be calibrated. This implies a very accurate power adjustment accuracy achieved with less calibration effort.

Figure 6A:
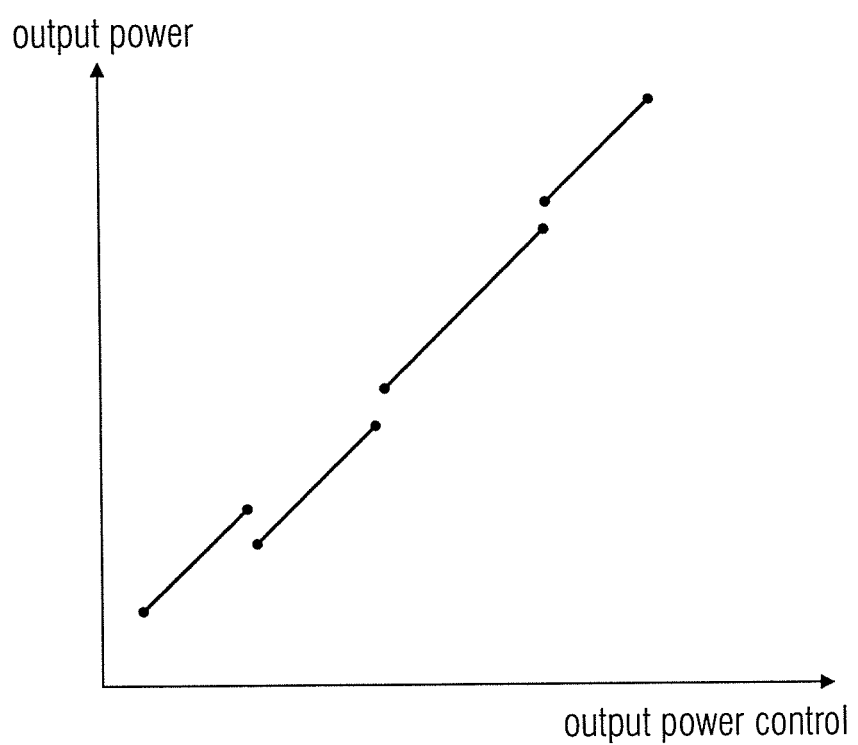
FIG. 6a shows in a diagram a relationship between output power control and output power with discontinuities.
Figure 6B:
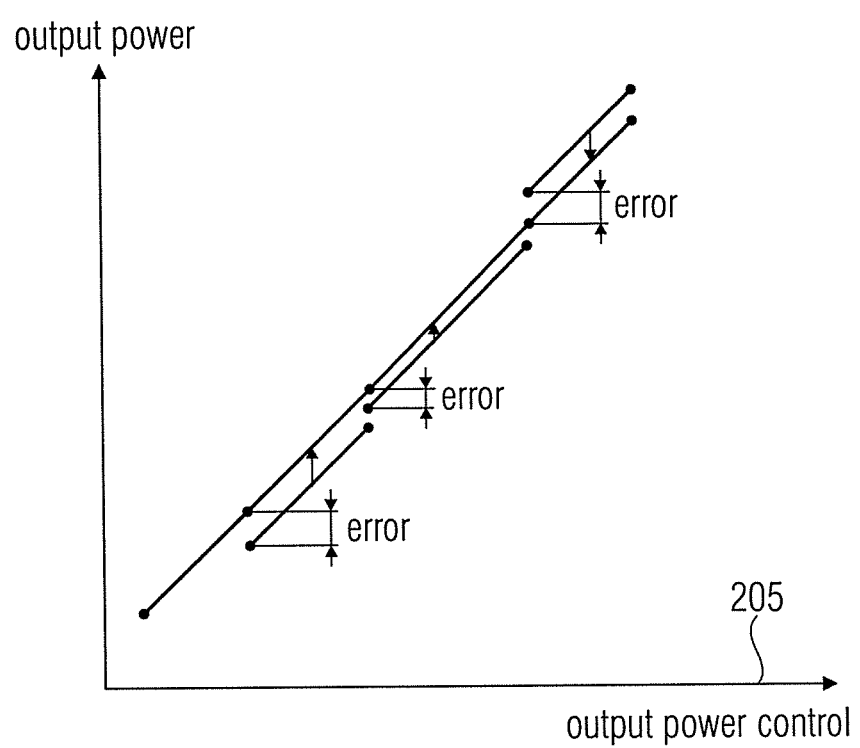
FIG. 6b shows the diagram from FIG. 6a with an additional discontinuity compensation.

FIG. 6a shows in a diagram a relationship between output power control and output power with discontinuities between the different linear segments. The length of the linear section, respectively the number of discrete steps is dependent on the method of implementation (area, current). Using a calibration mechanism it is possible to find the height of the steps. Thus, the linear segments can be shifted to achieve a linear function, as shown in the diagram FIG. 6b.

As an example, this discontinuity compensation can be performed in the gain controller 101 using the discontinuation compensation lookup table 252 to achieve a linear relationship between the output power control value 205 and the achieved output power of the output signal 117.

FIG. 6c shows an exemplary implementation for the power to gain mapper 203 and the gain controller 101 using a table 607 containing all possible control settings with all parameters for adjusting the power in the linear region and with discrete power steps. As an example, the gain controller 101 can be configured to derive using the table 607 the gain adjust signal 111 for the first amplifier 103 to adjust a first gain 601 of the first amplifier 103 and the switch code 123 for the second amplifier 105 to adjust a second gain 603 of the second amplifier 105. The first gain 601 and the second gain 603 together form a combined gain 605 of the complete amplifier circuit which comprises the first amplifier 103 and the second amplifier 105.

Figure 6D:
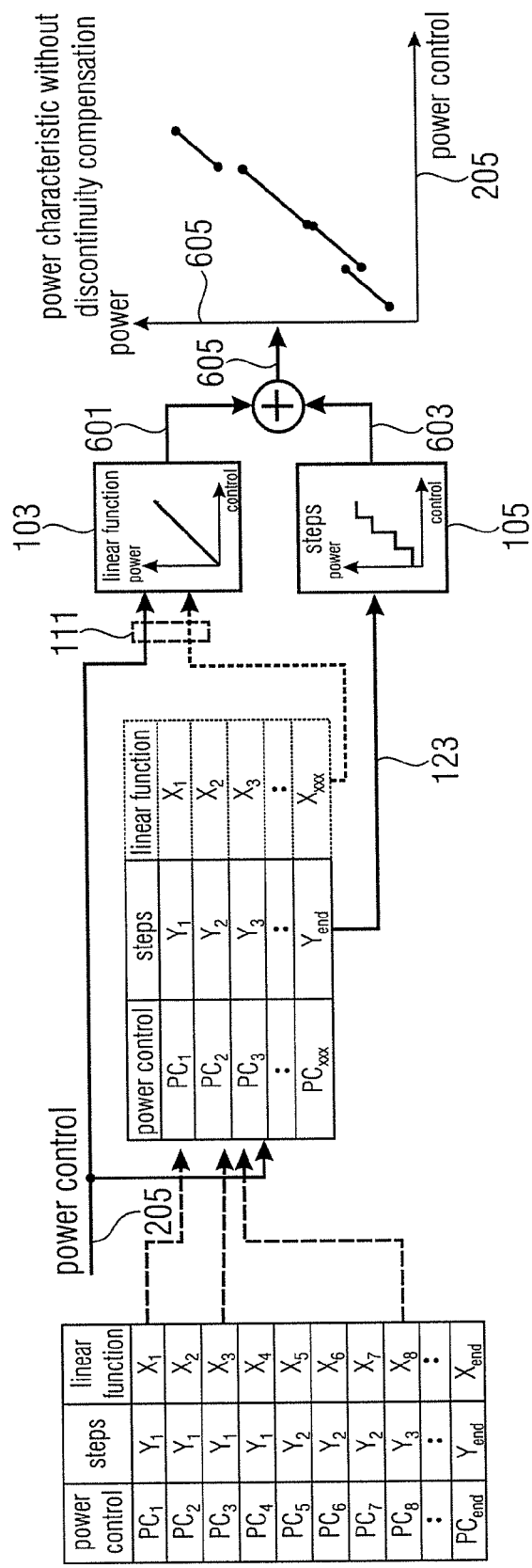
FIG. 6d shows a further example of how the combined gain can be derived without discontinuity compensation.

Another solution is shown in FIG. 6d in which only those power control settings are used where power steps occur along with the discrete power steps themselves. Similar sections between the discrete power points can be achieved by means of digital hardware. As an example, the level of a signal can be scaled with a multiplier (e.g. with the multipliers 251, 501a, 501b) within digital signal processing. The linear functionality of the first amplifier 103 can easily be calculated. Such an implementation is shown in FIG. 6d.

Figure 6E:
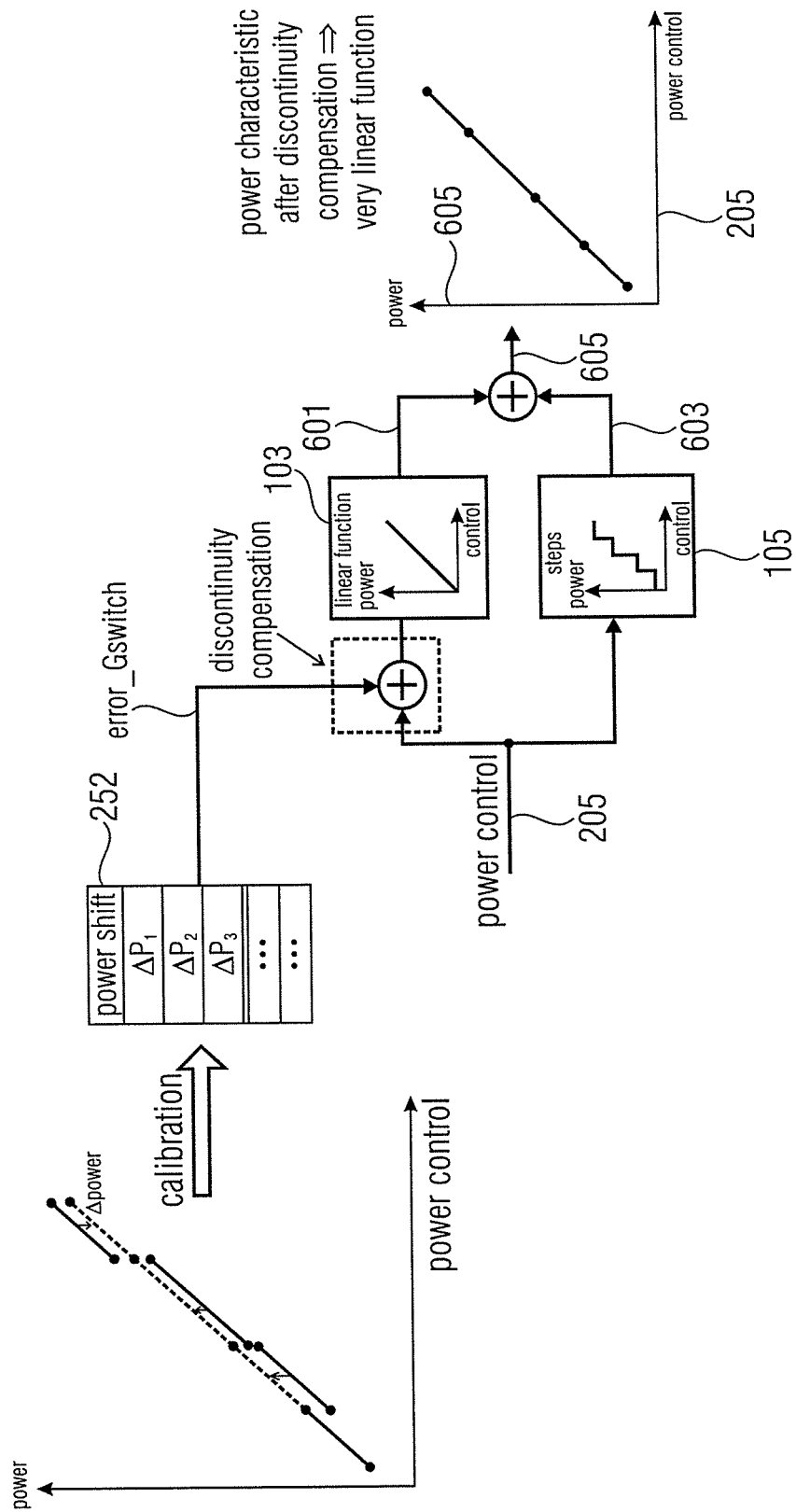
FIG. 6e shows an example of how the combined gain can be derived with a discontinuity compensation.

FIG. 6e shows another implementation in which inaccurate gain steps of the second amplifier 205 are compensated. These inaccurate gain steps can lead to discontinuities in the output power versus power control (value) characteristic. To get rid of the discontinuities in the power versus power control characteristic, a calibration process can measure the steps and calculate the necessary shift values for all linear segments to end up with a very linear function of output power vs. power control value. The found shift values can be added to the linear power adjustment function (in the gain controller 101 as the discontinuity compensation values). The information of the shifts can be stored, for example, in the discontinuity compensation lookup table 252. In other words, the gain controller 101 is configured to perform a discontinuity compensation of inaccurate gain steps of the second amplifier 105 based on the discontinuity compensation look up table 252 applied to the gain adjust signals 111, 503a, 503b for the first amplifier 103.

If the design of the discrete steps is subject to less process variation which can be identified (e.g. by measurement or simulation), the discontinuities can be considered within the implementation of the transmit device and no calibration process is required.

If it is possible to achieve enough dynamic range with the linear power adjustment function, a very easy solution could be to use no power steps at all. Therefore, no calibration process, or a very simple calibration process (measure only absolute power), may be sufficient, as described in conjunction with FIG. 3 and the measurement of the calibration pair.

FIG. 7 shows an application example for an operation of an exemplary amplifier circuit.

At first, a calibration of the amplifier circuit can be performed to determine the calibration pair as described in conjunction with FIG. 3.

Furthermore, during the calibration process an error measuring can be performed to derive the discontinuity compensation lookup table 252. The discontinuity compensation lookup table 252 then comprises for each desired gain value and therefore for each power control value a discontinuity compensation value.

The discontinuity compensation value is derived such that no interpolation is necessary and it can be directly added in the linear function to derive the gain adjust signals 111, 503a, 503b.

If now, in a simple example, the output power should be increased by one dB (for example from a current power of 20 dBm to a desired power of 21 dBm) the desired gain value 109 is calculated using the formula as described in conjunction with FIG. 3:

$$PC = PCref + (Psoll - Pref) * k \text{ (e.g. } k=16\text{)}.$$

In this formula PC equals the desired gain value 109, PCref equals the reference gain value, Psoll equals the desired output power indicated by the power control value 205, Pref equals the reference output power of the amplifying circuit and k is a proportionality constant.

Based on this formula, the actual gain value can be derived as 1975 and the desired gain value can be derived as 1991.

Advantages of the power adjustment strategy shown in FIG. 7 are low calibration efforts, less points for calibration, an easy correction of temperature, an easy determination of the power control values (of the desired gain value) and a very linear function between the power control value 205 and the achieved output power of the amplifying circuit.

Furthermore, as can be seen in FIG. 7, a compensation of the environmental conditions can be performed (e.g. as described in conjunction with FIG. 4d) having additional compensation values for different environmental conditions (such as cold, ambient or warm for the environmental condition temperature).

The attention is also drawn to FIG. 3 in which the application example of FIG. 7 is also illustrated. For FIG. 3 it can be seen that based on the calculated desired gain value 1991 the gain controller 101 chooses the value for the switch code 123 which corresponds to the next larger desired gain value in the lookup table 207. Hence, the gain controller 101 chooses the value 30 for the switch code 123 corresponding to the desired gain value 2015.

Furthermore, the gain controller 101 chooses based on the discontinuity compensation lookup table 252 the compensation value −2 and derives based on the desired gain value 1991 and the discontinuity compensation value −2 the gain adjust signal 111.

Figure 8:
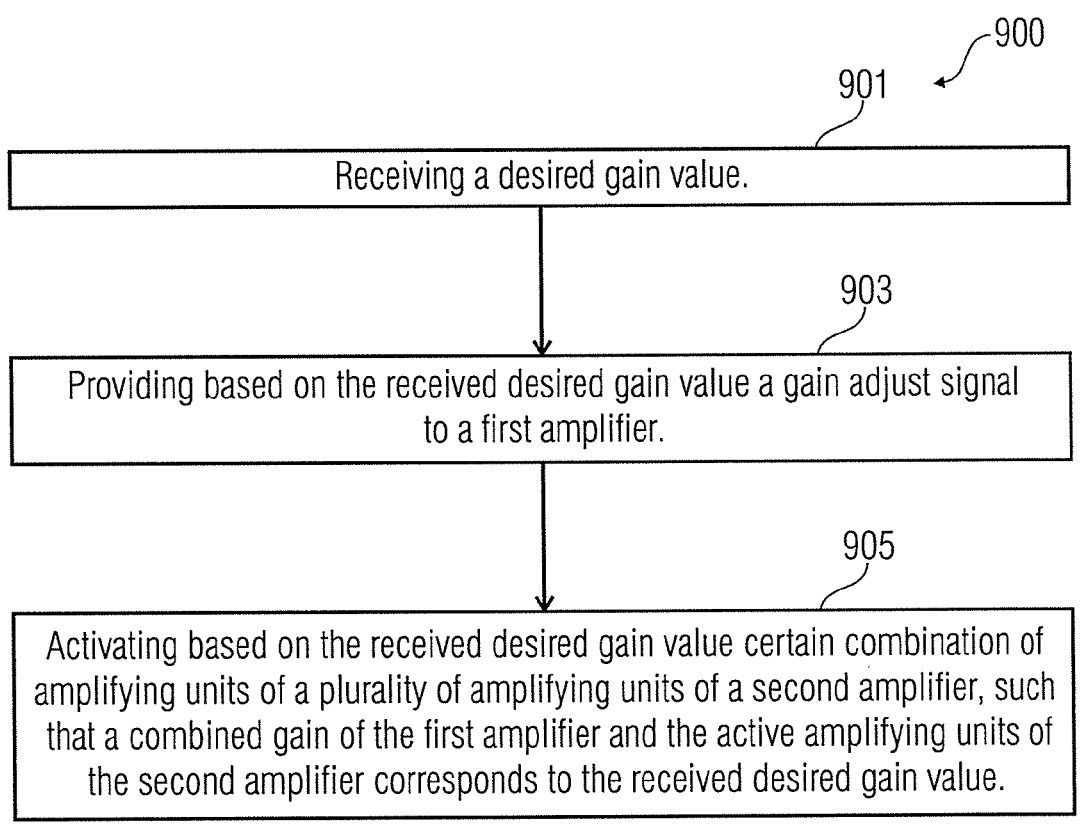
FIG. 8 shows a flow diagram of a method for amplifying a signal.

FIG. 8 shows a flow diagram of an exemplary method 900 for amplifying a signal.

The method 900 comprises receiving a desired gain value at 901.

Furthermore, the method 900 comprises providing, based on the received desired gain value, a gain adjust signal to a first amplifier at 903.

Furthermore, the method 900 comprises activating, based on the received desired gain value, a certain combination of amplifying units of a plurality of amplifying units of a second amplifier, such that a combined gain of the first amplifier and the active amplifying units of the second amplifier corresponds to the received desired gain value at 915.

The method 900 may be supplemented by any of the features and functionalities described herein with respect to the apparatus, and may be implemented using the hardware components of the apparatus.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some examples, some one or more of the most important method steps may be executed by such an apparatus.

Depending on certain implementation requirements, examples can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some examples comprise a data carrier having electronically readable control signals, which are capable of cooperating with a programmable computer system, such that one of the methods described herein is performed.

Generally, examples can be implemented as a computer program product with a program code, the program code being operative for performing one of the methods when the computer program product runs on a computer. The program code may for example be stored on a machine readable carrier.

Other examples comprise the computer program for performing one of the methods described herein, stored on a machine readable carrier.

In other words, an implementation of the exemplary method is, therefore, a computer program having a program code for performing one of the methods described herein, when the computer program runs on a computer.

A further implementation of the exemplary method is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further implementation of the exemplary method is, therefore, a data stream or a sequence of signals representing the computer program for performing one of the methods described herein. The data stream or the sequence of signals may for example be configured to be transferred via a data communication connection, for example via the Internet.

A further example comprises a processing means, for example a computer, or a programmable logic device, configured to or adapted to perform one of the methods described herein.

A further example comprises a computer having installed thereon the computer program for performing one of the methods described herein.

A further example comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some examples, a programmable logic device (for example a field programmable gate array) may be used to perform some or all of the functionalities of the methods described herein. In some examples, a field programmable gate array may cooperate with a microprocessor in order to perform one of the methods described herein. Generally, the methods are preferably performed by any hardware apparatus.

The above described examples are merely illustrative. It is understood that modifications and variations of the arrangements and the details described herein will be apparent to others skilled in the art. It is the intent, therefore, to be limited only by the scope of the impending patent claims and not by the specific details presented by way of description and explanation of the examples herein.

Although each claim only refers back to one single claim, the disclosure also covers any conceivable combination of claims.

The invention claimed is:

1. An amplifier circuit comprising:
   a gain controller;
   a first amplifier; and
   a second amplifier which is coupled in series to the first amplifier, the second amplifier comprising a plurality of amplifying units,
   wherein the gain controller is configured to receive a desired gain value and provide, based on the received desired gain value, a gain adjust signal to the first amplifier, and activate, based on the received desired gain value, a certain combination of amplifying units of the plurality of amplifying units of the second amplifier, such that a combined gain of the first amplifier and the active amplifying units of the second amplifier corresponds to the received desired gain value,
   wherein the second amplifier comprises a plurality of amplifying stages which are coupled in series between an input of the second amplifier and an output of the second amplifier, and
   wherein at least one amplifying stage of the plurality of amplifying stages comprises at least two amplifying units of the plurality of amplifying units, wherein the at least two amplifying units are coupled in parallel between an input and an output of the amplifying stage.

2. The amplifier circuit according to claim 1, wherein the gain controller is configured to provide, based on the desired gain value for activating the certain amplifying units, an associated switch code to the at least one amplifying stage, the switch code indicating the amplifying units of the amplifying stage to be activated.

3. The amplifier circuit according to claim 1,
   wherein the gain controller is configured to provide, based on the desired gain value for activating the certain amplifying units, a plurality of switch codes to the second amplifier; and
   wherein each switch code of the plurality of switch codes is associated with an amplifying stage of the plurality of amplifying stages and indicates the amplifying units of the associated amplifying stage to be activated.

4. The amplifier circuit according to claim 1,
   wherein the gain controller is configured to provide, based on the desired gain value for activating the certain amplifying units, a switch code to the second amplifier, the switch code indicating the amplifying units of the second amplifier to be activated; and
   wherein the gain controller is configured to derive the gain adjust signal based on a difference between the desired gain value and a gain value associated to the switch code.

5. The amplifier circuit according to claim 1,
   wherein the gain controller comprises a discontinuity compensation look up table in which for each desired gain value a discontinuity compensation value is provided; and
   wherein the gain controller is further configured to derive the gain adjust signal based on the discontinuity compensation value provided in the discontinuity compensation look up table for the desired gain value.

6. The amplifier circuit according to claim 1,
   wherein an amplifying unit of the plurality of amplifying units is configured to apply, in an activated state, a corresponding gain to a second amplifier input signal received at an input of the second amplifier; and
   wherein a second amplifier gain applied by the second amplifier to the second amplifier input signal is a sum of the corresponding gains of the activated amplifying units of the second amplifier.

7. The amplifier circuit according to claim 1, wherein an amplifying unit of the plurality of amplifying units is configured to apply, in an activated state, a corresponding gain to a second amplifier input signal received at an input of the second amplifier, and omit, in a deactivated state, applying the corresponding gain to the second amplifier input signal.

8. The amplifier circuit according to claim 7, wherein the corresponding gain of the amplifying unit is non-adjustable.

9. The amplifier circuit according to claim 1, wherein the first amplifier comprises a digital amplifier configured to amplify a first amplifier input signal received at an input of the first amplifier based on the gain adjust signal in a digital domain.

10. The amplifier circuit according to claim 1, wherein the first amplifier comprises a digital multiplier which is configured to multiply a first amplifier input signal received at an input of the first amplifier with the gain adjust signal to derive a second amplifier input signal which is provided to an input of the second amplifier.

11. The amplifier circuit according to claim 1,
wherein the first amplifier is configured to receive a first amplifier input signal which is a magnitude part of a complex transmit signal, the complex transmit signal comprising the magnitude part and a phase part; and
wherein the first amplifier is configured to apply in dependence on the gain adjust signal, a gain to the magnitude part.

12. The amplifier circuit according to claim 1, wherein an output of the first amplifier is coupled to an input of the second amplifier.

13. The amplifier circuit according to claim 12, further comprising a digital-to-analog converter coupled between the output of the first amplifier and the input of the second amplifier.

14. An amplifier circuit comprising:
a gain controller;
a first amplifier;
a second amplifier which is coupled in series to the first amplifier, the second amplifier comprising a plurality of amplifying units,
wherein the gain controller is configured to receive a desired gain value and provide, based on the received desired gain value, a gain adjust signal to the first amplifier, and activate, based on the received desired gain value, a certain combination of amplifying units of the plurality of amplifying units of the second amplifier, such that a combined gain of the first amplifier and the active amplifying units of the second amplifier corresponds to the received desired gain value; and
a power to gain mapper configured to receive a power control value indicating a desired power of an output signal at an output of the amplifier circuit, and provide, based on the received power control value, the desired gain value to the gain controller.

15. The amplifier circuit according to claim 14,
wherein the power to gain mapper comprises an amplifier circuit specific calibration pair of a reference gain value and a resulting reference output power of the amplifying circuit; and
wherein the power to gain mapper is configured to derive the desired gain value further based on the calibration pair.

16. The amplifier circuit according to claim 14, wherein the power to gain mapper is further configured to derive the desired gain based on at least one current environmental condition out of: bias voltage of the amplifier circuit, temperature of the amplifier circuit, supply voltage of the amplifier circuit and frequency of an input signal of the amplifier circuit.

17. The amplifier circuit according to claim 16, wherein the power to gain mapper is configured to choose, based on the current environmental condition, a compensation value out of a plurality of compensation values, and derive the desired gain value further based on the chosen compensation value.

18. An amplifier circuit comprising:
a gain controller;
a first amplifier; and
a second amplifier which is coupled in series to the first amplifier, the second amplifier comprising a plurality of amplifying units,
wherein the gain controller is configured to receive a desired gain value and provide, based on the received desired gain value, a gain adjust signal to the first amplifier, and activate, based on the received desired gain value, a certain combination of amplifying units of the plurality of amplifying units of the second amplifier, such that a combined gain of the first amplifier and the active amplifying units of the second amplifier corresponds to the received desired gain value,
wherein the first amplifier is configured to receive a first amplifier input signal comprising a real part and an imaginary part and apply a first gain to the real part and a second gain to the imaginary part.

19. The amplifier circuit according to claim 18, wherein the gain controller is further configured to provide the gain adjust signal for adjusting the first gain applied to the real part of the first amplifier input signal and provide a further gain adjust signal for adjusting the second gain applied to the imaginary part of the first amplifier input signal independent of the gain adjust signal for adjusting the first gain applied to the real part of the first amplifier input signal.

20. The amplifier circuit according to 19, wherein the gain controller is configured to derive based on the desired gain value, a base gain adjust signal and scale the base gain adjust signal by a first scaling factor to derive the gain adjust signal, and scale the base gain adjust signal by a second scaling factor independent of the first scaling factor to derive the further gain adjust signal.

21. A mobile communication device, comprising:
an antenna port;
an amplifier circuit comprising:
a gain controller;
a first amplifier; and
a second amplifier which is coupled in series to the first amplifier, the second amplifier comprising a plurality of amplifying units; and
wherein the gain controller is configured to receive a desired gain value and provide, based on the received desired gain value, a gain adjust signal to the first amplifier and activate, based on the received desired gain value, a certain combination of amplifying units of the plurality of amplifying units of the second amplifier, such that a combined gain of the first amplifier and the active amplifying units of the second amplifier corresponds to the received desired gain value;
a digital base band processor; and
wherein the amplifier circuit is coupled between the antenna port and the digital base band processor.

22. An amplifier circuit, comprising:
a gain controller;
a first amplifier;
a second amplifier comprising a plurality of amplifying stages;

wherein the plurality of amplifying stages are coupled in series between an input and an output of the second amplifier and each amplifying stage comprises a plurality of amplifying units coupled in parallel between an input and an output of the amplifying stage;

a digital-to-analog converter coupled between an output of the first amplifier and an input of the second amplifier; and a power to gain mapper configured to receive a power control value indicating a desired power of an output signal at an output of the amplifier circuit;

wherein the power to gain mapper comprises an amplifier circuit specific calibration pair of a reference gain value and a resulting reference output power of the amplifying circuit; and wherein the power to gain mapper is configured to provide, based on the received power control value and on the calibration pair, a desired gain value;

wherein the gain controller is configured to receive the desired gain value and provide, based on the received desired gain value, a gain adjust signal to the first amplifier, and provide, based on the received desired gain value for each amplifying stage of the second amplifier, an associated switch code indicating the amplifying units of the amplifying stage to be activated for activating a certain combination of amplifying units of the second amplifier, such that a combined gain of the first amplifier and the active amplifying units of the second amplifier corresponds to the received desired gain value;

wherein the gain controller comprises a discontinuity compensation look up table in which for each desired gain value a discontinuity compensation value is provided; and wherein the gain controller is further configured to derive the gain adjust signal based on the discontinuity compensation value provided in the discontinuity compensation look up table for the desired gain value.

* * * * *